(12) United States Patent
Iwasaka et al.

(10) Patent No.: US 8,558,226 B2
(45) Date of Patent: Oct. 15, 2013

(54) THIN FILM TRANSISTOR SUBSTRATE AND MANUFACTURING METHOD FOR THE SAME

(75) Inventors: Toshihiko Iwasaka, Kumamoto (JP); Kazunori Inoue, Kumamoto (JP); Masaru Aoki, Kumamoto (JP); Reiko Noguchi, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/480,980

(22) Filed: May 25, 2012

(65) Prior Publication Data

US 2012/0305911 A1 Dec. 6, 2012

(30) Foreign Application Priority Data

Jun. 1, 2011 (JP) ................................ 2011-123612

(51) Int. Cl.
*H01L 33/08* (2010.01)

(52) U.S. Cl.
USPC ............................... 257/43; 438/85; 438/104

(58) Field of Classification Search
USPC ........ 257/43, 59, 72, E29.151, E21.413–414; 438/85, 104, 149, 151–155, 158; 349/38, 42–43
See application file for complete search history.

(56) References Cited

U.S. PATENT DOCUMENTS

| | | | |
|---|---|---|---|
| 4,918,504 A | 4/1990 | Kato et al. | |
| 6,500,701 B2 * | 12/2002 | Higashi et al. | 438/149 |
| 7,196,352 B2 * | 3/2007 | Hung et al. | 257/59 |
| 2004/0180480 A1 | 9/2004 | Dejima | |
| 2005/0039670 A1 | 2/2005 | Hosono et al. | |
| 2006/0033862 A1 * | 2/2006 | Huang et al. | 349/110 |
| 2007/0148831 A1 | 6/2007 | Nagata et al. | |
| 2007/0238217 A1 * | 10/2007 | Shih | 438/69 |
| 2008/0012016 A1 * | 1/2008 | Inoue et al. | 257/59 |
| 2008/0191211 A1 * | 8/2008 | Yano et al. | 257/59 |

(Continued)

FOREIGN PATENT DOCUMENTS

| | | |
|---|---|---|
| JP | 64-35529 | 2/1989 |
| JP | 2004-103957 | 4/2004 |

(Continued)

OTHER PUBLICATIONS

Kenji Nomura, et al., "Room-temperature fabrication of transparent flexible thin-film transistors using amorphous oxide semiconductors", Nature vol. 432 Nov. 25, 2004, 5 pages.

*Primary Examiner* — Matthew Landau
*Assistant Examiner* — Michael Hung
(74) *Attorney, Agent, or Firm* — Oblon, Spivak, McClelland, Maier & Neustadt, L.L.P.

(57) ABSTRACT

Provided is a thin film transistor having a semiconductor film disposed in a plurality of portions on a substrate, a source electrode and a drain electrode which are disposed, on a semiconductor film, in contact with the semiconductor film while being spaced from each other, and a gate electrode which is disposed across the source electrode and the drain electrode via a gate insulating film; an auxiliary capacitance electrode which is disposed on the semiconductor film while in contact with the semiconductor film; a source line which has the semiconductor film in a lower layer, extends from the source electrode; a gate line which extends from the gate electrode; a pixel electrode which is electrically connected to the drain electrode; and an auxiliary capacitance electrode connecting line which electrically connects the auxiliary capacitance electrodes to each other in the adjacent pixels.

15 Claims, 26 Drawing Sheets

(56) References Cited

U.S. PATENT DOCUMENTS

2009/0108264 A1* 4/2009 Inoue et al. ............ 257/59
2009/0174835 A1* 7/2009 Lee et al. ............... 349/46
2011/0017993 A1* 1/2011 Tsuda et al. ........... 257/57

FOREIGN PATENT DOCUMENTS

| | | |
|---|---|---|
| JP | 2004-281687 | 10/2004 |
| JP | 2005-77822 | 3/2005 |
| JP | 2008-72011 | 3/2008 |

* cited by examiner

THIN FILM TRANSISTOR SUBSTRATE AND MANUFACTURING METHOD FOR THE SAME

BACKGROUND OF THE INVENTION

1. Field of the Invention

The present invention relates to a thin film transistor substrate constituting a display, and a manufacturing method for the same.

2. Description of the Background Art

A TFT active matrix substrate (hereinafter referred to as "TFT substrate") employing a thin film transistor (hereinafter referred to as "TFT") as a switching element is, for example, used for an electro-optic apparatus such as a display using a liquid crystal (hereinafter referred to as "liquid crystal display").

As for the electro-optic apparatus using the TFT substrate, there have been demands for improvement in display performance such as higher definition and higher product quality, as well as a demand for reduction in manufacturing process to efficiently manufacture these in quest of low cost.

A back channel type TFT has hitherto been in use as the switching element of the TFT substrate for the liquid crystal display. Typically, amorphous silicon (Si) is used as a semiconductor active layer in the back channel type TFT for the liquid crystal display, and a structure called a reverse stagger type has been adopted thereto. These TFT substrates are manufactured normally after undergoing four or five times of photolithography steps.

Meanwhile, in response to the foregoing demand for reduction in manufacturing process, Japanese Patent Application Laid-Open No. S64-35529 (Japanese Patent Application Laid-Open No. H1-35529), Japanese Patent Application Laid-Open No. 2004-281687 (Japanese Patent No. 4522660) and the like disclose a manufacturing method where the photolithography steps are reduced to three times by means of a structure called a stagger type being different from the reverse stagger type.

Further, in response to the demand for improvement in display performance, a TFT has been vigorously developed in recent years, the TFT using as the active layer the oxide semiconductor that indicates higher mobility than that of conventional Si (Japanese Patent Application Laid-Open No. 2004-103957 (Japanese Patent No. 4164562), Japanese Patent Application Laid-Open No. 2005-77822, "Room-temperature fabrication of transparent flexible thin-film transistors using amorphous oxide semiconductors", Kenji Nomura, et. al., Nature 2004, Vol. 432, pp. 488-492).

As an oxide semiconductor material, research and development have been proceeded with focuses on a zinc oxide (ZnO) type, an IGZO type obtained by adding gallium oxide ($Ga_2O_3$) or indium oxide ($In_2O_3$) to zinc oxide (ZnO), or some other type.

The oxide semiconductor material as thus described has advantages of being etchable by a mild acidic solution such as oxalic acid or carboxylic acid, and being pattern-processed with ease. However, the oxide semiconductor material is also dissolved with ease by an acidic solution normally used at the time of etching a typical metal film (Cr, Ti, Mo, Ta, Al, Cu or an alloy of these) for use in a source electrode and a drain electrode of the TFT.

Accordingly, in the case of manufacturing the TFT using the oxide semiconductor as the active layer, for example as disclosed in Japanese Patent Application Laid-Open No. 2008-72011, the TFT is manufactured such that, even when a new element for improvement in resistance of the oxide semiconductor to a medical solution is added or film thicknesses of an oxide semiconductor film or a metal film are rightsized to remove the metal film by etching, the oxide semiconductor film does not disappear and remains.

The liquid crystal display using the TFT substrate is configured by bonding the TFT substrate with a counter substrate opposed thereto and injecting a liquid crystal between these substrates. On the TFT substrate, a TFT and a pixel electrode are arranged in an area surrounded by a plurality of scanning lines (gate lines) in a horizontal direction and a plurality of signal lines (source lines) orthogonal to these lines, to form a matrix shape. A counter electrode supplied with a constant voltage is formed on the counter substrate, and a liquid crystal capacitance is formed by liquid crystal held between the counter electrode and the pixel electrode.

A scanning signal is sequentially applied to the scanning line on the TFT substrate every horizontal scanning period, and further, a predetermined signal voltage is sequentially applied to the signal line (source line) in a vertical direction, to apply a display voltage to the corresponding pixel electrode so as to form an image. At this time, a predetermined charge is held in the liquid crystal capacitance over a frame period of horizontal scanning, thereby to realize display of a flat image for one frame. However, when the charge held in the liquid crystal capacitance fluctuates, a phenomenon of degradation in display quality such as flicker occurs. Hence a configuration has been adopted where, other than the liquid crystal capacitance, an auxiliary capacitance is formed in the pixel electrode on the TFT substrate to alleviate fluctuations in charge so as to prevent deterioration in display quality.

However, in the conventional manufacturing method for the TFT substrate where the photolithography steps are reduced to three times, the auxiliary capacitance is difficult to form. For example, as for the TFT substrate manufactured by the manufacturing method disclosed in foregoing Japanese Patent Application Laid-Open No. S64-35529 (Japanese Patent Application Laid-Open No. H1-35529), the configurations of the TFT and the pixel electrode are described (FIGS. 1 and 5), but the configuration of the auxiliary capacitance is not described.

Further, as for the TFT substrate manufactured by the manufacturing method disclosed in foregoing Japanese Patent Application Laid-Open No. 2004-281687 (Japanese Patent No. 4522660), the configuration of the auxiliary capacitance is described, but this auxiliary capacitance is configured in such a form that the counter electrode opposed to the pixel electrode uses a part of a scanning line layer via an insulating film (FIGS. 28 and 29). For this reason, there remain a problem of a small degree of freedom in designing a capacitance value of the auxiliary capacitance, and further a problem of a small margin with respect to deterioration in display quality such as flicker due to the possibility for fluctuations in capacitance value.

Moreover, for example among the configurations of the TFT substrates disclosed in Japanese Patent Application Laid-Open No. S64-35529 (Japanese Patent Application Laid-Open No. H1-35529) and Japanese Patent Application Laid-Open No. 2004-281687 (Japanese Patent No. 4522660), there is also a configuration where a light shield film such as the metal film is not formed between a foundation substrate and a semiconductor material. There has thus been a problem in that in the case of using conventional Si as the semiconductor material, when back light is incident from the rear surface of the substrate for the purpose of image display, a photo carrier is generated in a channel part of the TFT to cause deterioration in ON/OFF ratio of TFT switching characteristics, and degraded contrast of the display image, a cross talk and inconsistencies in display are generated to cause deterioration in display quality.

Further, although Japanese Patent Application Laid-Open No. 2004-281687 (Japanese Patent No. 4522660) also discloses the configuration of the TFT substrate formed with a light shield film between the substrate and the semiconductor film (FIG. 31), this causes addition of a new step of forming the light shield film.

This problem can be solved by use of an oxide-system semiconductor material in place of conventional Si as the semiconductor material. That is, the oxide semiconductor has high mobility and is influenced in a small degree by generation of the photo carrier due to light as compared with Si, thereby allowing suppression of deterioration in display quality.

However, in the case of a TFT substrate using such an oxide semiconductor, as described above, it is difficult to perform selective etching by means of a medical solution with a conventionally known general metal film which becomes lines and an electrode material. There have thus been problems of reduction in process margin for manufacturing, deterioration in performance of the oxide semiconductor TFT, and the like.

SUMMARY OF THE INVENTION

It is an object of the present invention to provide a thin film transistor substrate for a display which is provided with high-performance thin film transistor and has high display quality, and a manufacturing method capable of realizing these substrates with favorable productivity efficiency.

An aspect of a thin film transistor substrate according to the present invention is a thin film transistor substrate with a plurality of pixels arrayed in matrix shape, each of the pixels including, a thin film transistor configured of a semiconductor film disposed in a plurality of portions on a substrate, a source electrode and a drain electrode which are disposed, on the semiconductor film of a first part on the substrate, in contact with the semiconductor film while being spaced from each other, and including a first conductive film, a gate insulating film which includes an insulating film and coats the semiconductor film, the source electrode and the drain electrode, and a gate electrode which is disposed across the source electrode and the drain electrode via the gate insulating film and including a second conductive film, an auxiliary capacitance electrode which is disposed on the semiconductor film of a second part on the substrate while in contact with the semiconductor film, and including the first conductive film, a source line which has the semiconductor film in a lower layer, extends from the source electrode, and includes the first conductive film, a gate line which extends from the gate electrode and includes the second conductive film, a pixel electrode which is electrically connected to the drain electrode, and including the second conductive film, an auxiliary capacitance electrode connecting line which is electrically connected to the auxiliary capacitance electrode, electrically connects auxiliary capacitance electrodes to each other in the adjacent pixels, and includes the second conductive film, wherein the auxiliary capacitance electrode and the source line are coated by the insulating film, and the gate line, the pixel electrode and the auxiliary capacitance electrode connecting line are disposed on the insulating film.

According to the above thin film transistor substrate, it is possible to obtain a thin film transistor substrate for a display which is provided with high-performance thin film transistor and has high display quality.

An aspect of a manufacturing method for a thin film transistor substrate according to the present invention is a manufacturing method for a thin film transistor substrate with a plurality of pixels arrayed in matrix shape, the method including the steps of, (a) forming a semiconductor film and a first conductive film in this order on a substrate, (b) patterning the first conductive film by a first photolithography step after the step (a), forming a source electrode and a drain electrode which constitute the thin film transistor, an auxiliary capacitance electrode and a source line, and also patterning the semiconductor film in a lower layer of the source electrode, the drain electrode, the auxiliary capacitance electrode and the source line such that the semiconductor film remains, (c) forming an insulating film entirely over the substrate surface, to form a gate insulating film which coats the source electrode and the drain electrode, (d) forming a plurality of first and second contact holes which penetrate the insulating film and respectively reach the surfaces of the drain electrode and the auxiliary capacitance electrode by a second photolithography step after the step (c), and (e) forming a second conductive film entirely over the substrate surface after the step (d), patterning the second conductive film by a third photolithography step, and forming a gate electrode which is across the source electrode and the drain electrode via the gate insulating film, a gate line which extends from the gate electrode, a pixel electrode which is electrically connected to the drain electrode via the first contact hole, and an auxiliary capacitance electrode connecting line which is electrically connected to the auxiliary capacitance electrode via the second contact hole and electrically connects the auxiliary capacitance electrodes to each other in the adjacent pixels, wherein the step (b) includes forming a first resist pattern with partially different film thicknesses due to at least two stages of exposure, and the first resist pattern is formed such that a thickness of a portion corresponding to a portion above a channel part between the source electrode and the drain electrode is smaller than thicknesses of the other portion.

According to the above manufacturing method for a thin film transistor substrate, it is possible to obtain a thin film transistor substrate for a display which is provided with high-performance thin film transistor and has high display quality by three times of photolithography steps, to thereby improve production efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A TFT substrate according to the present preferred embodiment will be described as an active matrix substrate using a thin film transistor as a switching element.

It is to be noted that the TFT substrate is used for a flat-type display (flat panel display) such as a liquid crystal display (LCD).

<Overall Configuration of TFT Substrate>

Figure 1:
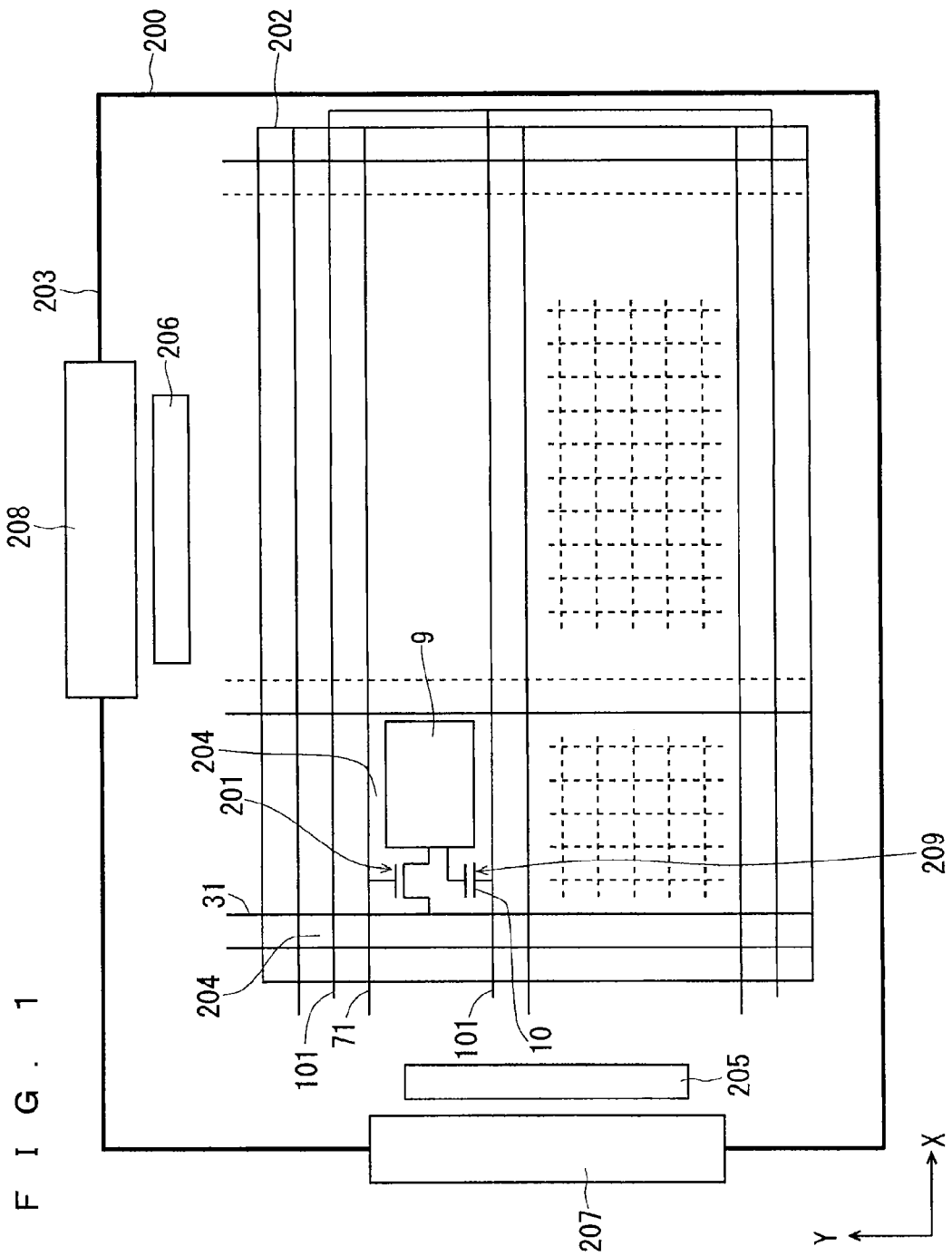
FIG. 1 is a plan view showing an overall configuration of a TFT substrate.

First, an overall configuration of the TFT substrate will be described using FIG. 1. FIG. 1 is a plan view schematically describing an overall configuration of a TFT substrate, and herein, a TFT substrate for LCD is taken as an example.

A TFT substrate 200 shown in FIG. 1 is a TFT array substrate with TFTs 201 arrayed in matrix shape, and broadly divided into a display area 202 and a frame area 203 provided so as to surround the display area 202.

In the display area 202, a plurality of gate lines (scanning signal lines) 71, a plurality of auxiliary capacitance electrodes 10 and a plurality of source lines (display signal lines) 31 are disposed. The plurality of gate lines 71 are disposed in parallel with one another, and the plurality of source lines 31 are disposed in parallel with one another so as to orthogonally intersect with the plurality of gate lines 71. In FIG. 1, the gate line 71 is disposed so as to extend in a lateral direction (X direction), and the source line 31 is disposed so as to extend in a longitudinal direction (Y direction).

Since an area surrounded by the adjacent gate lines 71 and adjacent source lines 31 serves as a pixel 204, the pixels 204 are configured to be arrayed in matrix shape in the TFT substrate 200.

In FIG. 1, a configuration of a part of the pixel 204 is shown in an enlarged manner, and at least one TFT 201 is disposed inside the pixel 204. The TFT 201 is arranged in the vicinity of an intersection of the source line 31 and the gate line 71. A gate electrode of the TFT 201 is connected to the gate line 71, a source electrode of the TFT 201 is connected to the source line 31, and a drain of the TFT 201 is connected to a pixel electrode 9. Further, an auxiliary capacitance 209 is connected to the pixel electrode 9, and an auxiliary capacitance electrode 10 is connected to an auxiliary capacitance line 101 provided in parallel with each of the plurality of gate lines 71.

The gate lines 71 and the auxiliary capacitance lines 101 are alternatively disposed, and the auxiliary capacitance line 101 and the source line 31 are disposed so as orthogonally intersect with each other.

The frame area 203 of the TFT substrate 200 is provided with a scanning signal driving circuit 205 and a display signal driving circuit 206. The gate line 71 extends from the display area 202 to the frame area 203 on the side provided with the scanning signal driving circuit 205, and the gate line 71 is connected to the scanning signal driving circuit 205 at the end of the TFT substrate 200.

The source line 31 also extends from the display area 202 to the frame area 203 on the side provided with the display signal driving circuit 206, and the source line 31 is connected to the display signal driving circuit 206 at the end of the TFT substrate 200.

Further, a connected substrate 207 to the outside is disposed in the vicinity of the scanning signal driving circuit 205, and a connected substrate 208 to the outside is disposed in the vicinity of the display signal driving circuit 206. Note that the connected substrates 207, 208 are each a wiring substrate such as an FPC (Flexible Printed Circuit).

A variety of signals are supplied from the outside to the scanning signal driving circuit 205 and the display signal driving circuit 206 respectively via the connected substrates 207, 208. The scanning signal driving circuit 205 supplies a gate signal (scanning signal) to the gate line 71 based on a control signal from the outside. With this gate signal, the gate line 71 is sequentially selected. The display signal driving circuit 206 supplies the source line 31 with the control signal from the outside and a display signal based on display data. This allows supply of a display voltage in accordance with the display data to each pixel 204.

It is to be noted that the configuration of the scanning signal driving circuit 205 and the display signal driving circuit 206 is not restricted to arrangement of those driving circuits on the TFT substrate 200, and for example, the driving circuits may be each configured of a TCP (Tape Carrier Package) and arranged in a different portion from the TFT substrate 200.

Moreover, the auxiliary capacitance electrode 10 is configured so as to be overlapped with (superimposed on) the pixel electrode 9 in a planar view, and an auxiliary capacitance 209 is formed with the pixel electrode 9 regarded as one electrode and the auxiliary capacitance electrode 10 as the other electrode. The auxiliary capacitance electrode 10 inside each pixel 204 is connected and converged into the auxiliary capacitance line 101, and for example, a common potential is supplied from the scanning signal driving circuit 205, the display signal driving circuit 206 or the like.

The TFT 201 functions as a switching element for supply of a display voltage to the pixel electrode 9, and ON/OFF of the TFT 201 is controlled by means of a gate signal inputted from the gate electrode. A predetermined voltage is then applied to the gate electrode, to turn on the TFT 201, and a current comes to flow from the source line 31. Thereby, the display voltage is applied from the source line 31 to the pixel electrode 9 connected to the drain electrode of the TFT 201, to generate an electric field in accordance with the display voltage between the pixel electrode 9 and a counter electrode (not shown). Between the pixel electrode 9 and the counter electrode, a liquid crystal capacitance (not shown) is formed of liquid crystal in parallel with the auxiliary capacitance 209. It is to be noted that in the case of an IPS (In Plane Switching) system liquid crystal display, the counter electrode is arranged on the TFT substrate 200 side.

The display voltage applied by the liquid crystal capacitance and the auxiliary capacitance 209 to the pixel electrode 9 is held for a fixed period. In addition, an alignment film (not shown) may be formed on the surface of the TFT substrate 200.

Further, a counter substrate, not shown, is arranged on the TFT substrate 200. The counter substrate is, for example, a color filter substrate, and is arranged on the viewable side. The counter substrate is formed with a color filter, a black matrix (BM), the counter electrode, the alignment film, and the like.

The TFT substrate 200 and the counter substrate are bonded to each other via a fixed gap (cell gap). This gap is then injected with liquid crystal, and sealed. That is, a liquid crystal layer is held between the TFT substrate 200 and the counter substrate. Further, a polarizing plate, an optical retardation plate, and the like are provided on a plane outside the TFT substrate 200 and the counter substrate. Moreover, a back light unit and the like are disposed on the opposite side to the viewable side of a liquid crystal display panel as thus configured. With the TFT substrate 200 arranged on the opposite side to the viewable side and the counter substrate arranged on the viewable side, the back light unit is arranged outside the TFT substrate 200.

<Operation of Liquid Crystal Display>

The liquid crystal is driven by an electric field between the pixel electrode 9 and the counter electrode. That is, an alignment direction of the liquid crystal between the substrates changes. This leads to a change in polarization state of light that passes through the liquid crystal layer. The liquid crystal layer changes a polarization state of light having passed through the polarizing plate and becoming linear polarized light.

Specifically, light from the back light unit is turned to linear polarized light by the polarizing plate on the TFT substrate 200 side. This linear polarized light passing through the liquid crystal layer leads to a change in polarization state.

Therefore, an amount of light that passes through the polarizing plate on the counter substrate side changes in accordance with the polarization state. That is, among transmitted light transmitted through the liquid crystal display panel from the back light unit, the amount of light that passes through the polarizing plate on the viewable side changes. The alignment direction of the liquid crystal changes in accordance with the display voltage applied. Therefore, controlling the display voltage can change the amount of light that passes through the polarizing plate on the viewable side. That is, changing the display voltage with respect to each pixel can display a desired image in the liquid crystal display.

<Configuration of Pixel of TFT Substrate>

Figure 2:
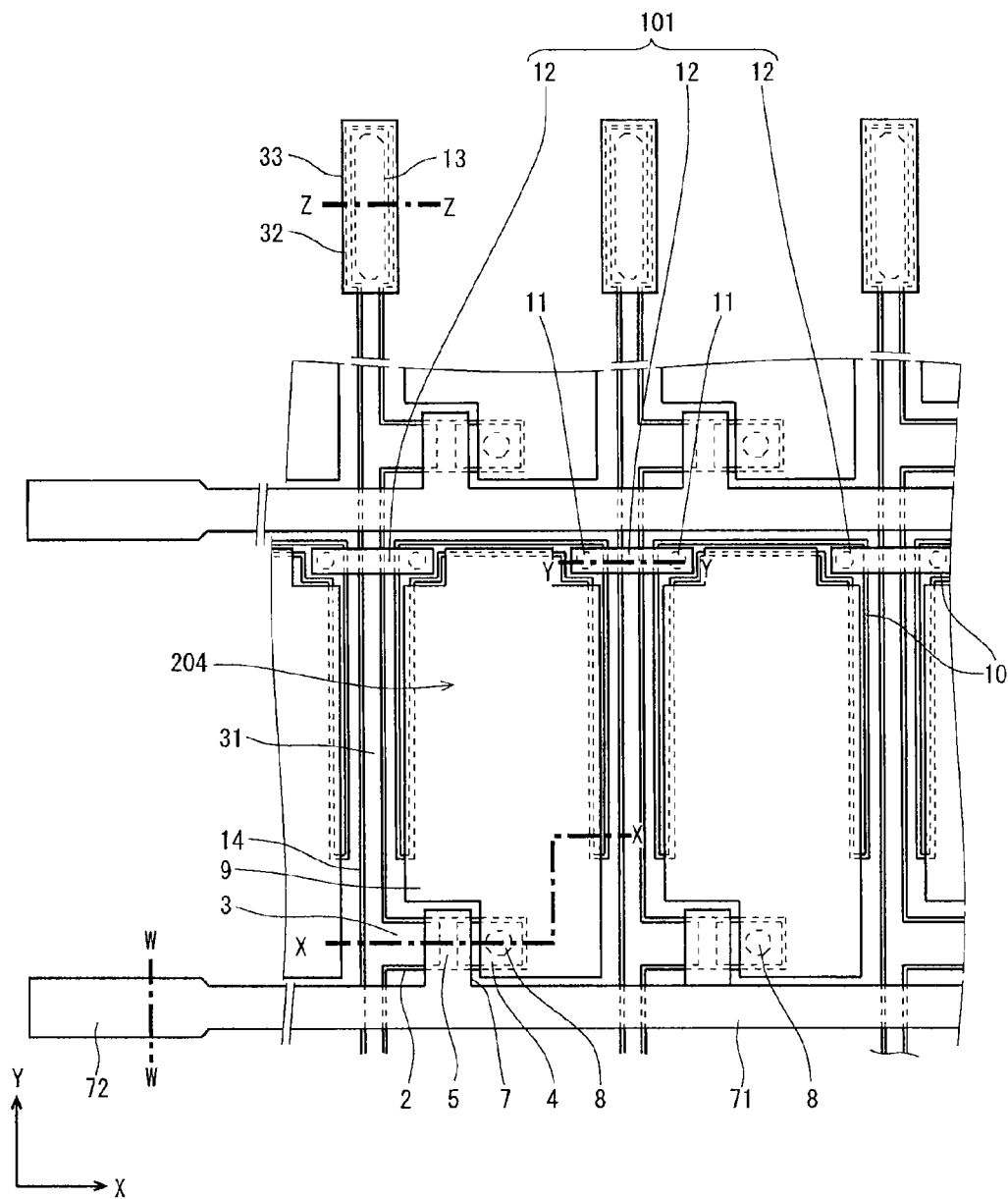
FIG. 2 is a plan view schematically showing a plane configuration of a thin film transistor substrate in a first preferred embodiment according to the present invention.

Next, a configuration of the pixel 204 on the TFT substrate 200 will be described with reference to FIGS. 2 and 3. FIG. 2 is a plan view schematically showing a plain configuration of the pixel 204, and FIG. 3 is a sectional view showing a sectional configuration along a line X-X in FIG. 2 (sectional configuration of a pixel TFT part), a sectional configuration along a line Y-Y (sectional configuration of an auxiliary capacitance line connecting part), a sectional configuration along a line W-W (sectional configuration of a gate terminal part), and a sectional configuration along a line Z-Z (sectional configuration of a source terminal part), respectively as a part (a), a part (b), a part (c) and a part (d).

Figure 3:
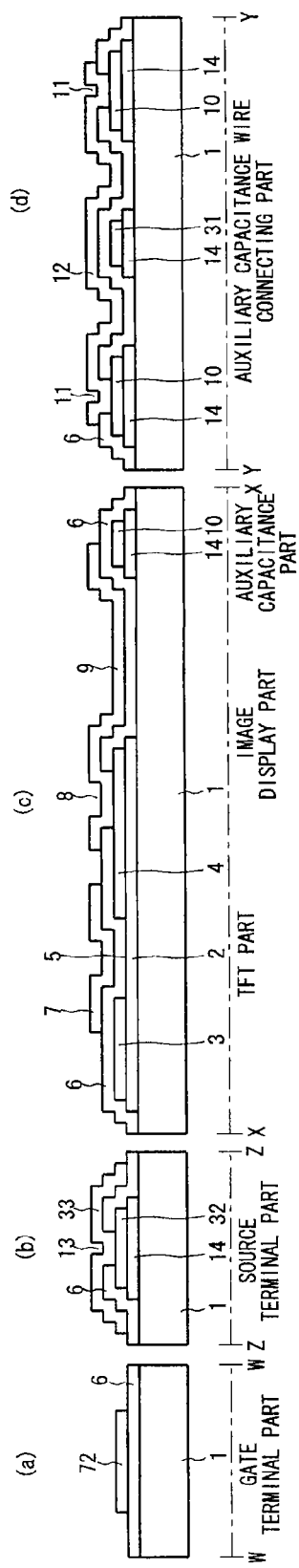
FIG. 3 is a sectional view schematically showing a sectional configuration of a pixel.

As shown in FIG. 3, the TFT substrate 200 is formed, for example, on a substrate 1 being a transparent insulating substrate such as glass, and as shown in the part (c) in FIG. 3, the pixel TFT part is configured such that a semiconductor film 2 is disposed on the substrate 1, and a source electrode 3 and a drain electrode 4 each including a metal film are disposed thereon while spaced from each other, and a channel part 5 is formed between the source electrode 3 and the drain electrode 4 inside the surface of the semiconductor film 2. A gate insulating film 6 is then disposed so as to cover these, and a gate electrode 7 is further formed above the gate insulating film 6 so as to coat the top of the channel part 5 in a lower layer, to constitute the TFT part 201.

Further, a pixel drain contact hole 8 is formed in the gate insulating film 6 on the drain electrode 4, and via this pixel drain contact hole 8, a pixel electrode 9 is disposed which is electrically connected with the drain electrode 4 in a lower layer. A part of the pixel electrode 9 is superimposed on the pattern of the auxiliary capacitance electrode 10 coated by the gate insulating film 6 in a planar view, and this superimposed area forms an auxiliary capacitance part 209. The gate electrode 7 and the pixel electrode 9 include the same layer. Further, the auxiliary capacitance electrode 10 includes laminated film obtained by laminating the semiconductor film 14 as the lowermost layer and the metal film constituting the source electrode 3 and the drain electrode 4

As shown in FIG. 2, the plurality of source lines 31 are provided in parallel with each other so as to extend in the longitudinal direction (Y direction). Further, the source lines 31 are formed so as to be integrated with the source electrode 3 of the TFT 201 in each pixel. Moreover, similarly to the auxiliary capacitance electrode 10 as shown in the part (d) in FIG. 3, the source line 31 includes a laminated film obtained by laminating the semiconductor film 14 as the lowermost layer and the metal film constituting the source electrode 3.

As shown in FIG. 2, the auxiliary capacitance electrode 10 is arranged with its planar view being a square U-shape such that a part of a pattern of the pixel electrode 9 in the upper layer is superimposed thereon in each pixel area. It is to be noted that the shape of the auxiliary capacitance electrode 10 is not restricted to the square U-shape, but may be a linear shape or an L-shape so long as a desired auxiliary capacitance is obtained.

The plurality of gate lines 71 are provided in parallel with each other so as to extend in the lateral direction (X direction) and thus orthogonally intersect with the source lines 31. Further, the gate lines 71 are formed so as to be integrated with the gate electrode 7 of the TFT 201 in each pixel. That is, the gate line 71 in the TFT 201 part serves as the gate electrode 7. The gate electrode 7 may have a wider shape than the gate line 71 as corresponding to the arrangement of the TFT 201, or may have a shape formed by branching off from the gate line and protruding to the pixel area.

As shown in the part (d) in FIG. 3, the auxiliary capacitance line connecting part on the substrate 1 is provided with a contact hole 11 for connection between auxiliary capacitance electrodes in the gate insulating film 6 in the upper layer of the auxiliary capacitance electrodes 10 respectively disposed in mutually adjacent pixels, and an auxiliary capacitance electrode connecting line 12 for striding over the source line 31 in a lower layer via the contact hole 11 for connection between auxiliary capacitance electrodes to connect the auxiliary capacitance electrodes 10 in the respective pixels.

An auxiliary capacitance connecting line 12 is arranged so as to link in chained shape between the auxiliary capacitance electrodes 10 in the mutually adjacent pixels, thereby forming one auxiliary capacitance line 101 obtained by electrically serially connecting between a plurality of pixels (pixel row) arrayed between two gate lines 71.

This can facilitate linkage between the auxiliary capacitance electrodes 10 which are each independent with respect to each pixel, thereby eliminating the need for a manufacturing step for a line that converges a plurality of auxiliary capacitance electrodes 10, so as to simplify the manufacturing process.

Further, the auxiliary capacitance lines 101 in each pixel row are further converged, to form, for example, a configuration where a common potential is supplied to the scanning signal driving circuit 205 (FIG. 1) or the display signal driving circuit 206 (FIG. 1).

As shown in the part (b) in FIG. 3, a source terminal 32 extended from the source line 31 is disposed in the source terminal part on the substrate 1. The source terminal 32 includes a laminated film obtained by laminating the semiconductor film 14 as the lowermost layer and the metal film constituting the source electrode 3. The gate insulating film 6 on the source terminal 32 is provided with a contact hole 13 in the source terminal part, and a source terminal pad 33 is connected to the source terminal 32 via this contact hole 13 in the source terminal part. The source terminal pad 33 is connected with the display signal driving circuit 206 (FIG. 1), and it is thus configured that an image display signal is supplied to the source line 31.

As shown in the part (a) in FIG. 3, a gate terminal 72 extended from the gate line 71 is formed in the gate terminal part on the substrate 1. The gate terminal 72 is disposed on the gate insulating film 6 on the substrate 1, and including a metal film constituting the gate electrode 7. The gate terminal 72 is connected with the scanning signal driving circuit 205 (FIG. 1), and it is thus configured that a scanning signal is supplied to the gate line 71.

<Manufacturing Method for TFT Substrate>

Next, a manufacturing method for the TFT substrate 200 will be described using FIGS. 4 to 15. It is to be noted that a sectional view showing a final step corresponds to FIG. 3, and each of the parts (a) to (d) in FIG. 3 indicates the same portion in each sectional view describing the manufacturing process in the following descriptions.

Figure 4:
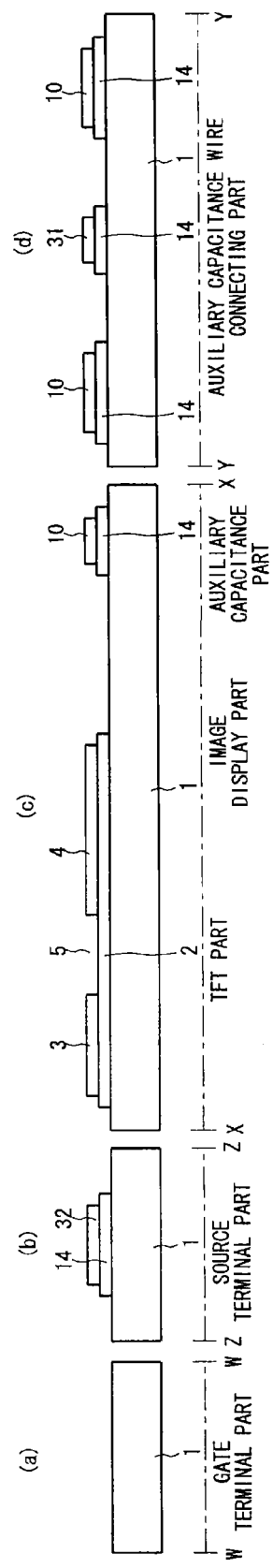
FIG. 4 is a sectional view at a stage where a source electrode and a drain electrode have been patterned in a description of a manufacturing method for a thin film transistor substrate in the first preferred embodiment according to the present invention.

First, as shown in the part (c) in FIG. 4, the semiconductor film 2 is patterned in the TFT part on the substrate 1, and the source electrode 3 and the drain electrode 4 are patterned thereon. In the steps up to here, the source terminal 32 is formed in the source terminal part as shown in the part (b) in FIG. 4, the auxiliary capacitance electrode 10 and the source line 31 are formed in the auxiliary capacitance line connecting part as shown in the part (d) in FIG. 4, and the auxiliary capacitance electrode 10 is formed in the auxiliary capacitance part 209 as shown in the part (c) in FIG. 4.

Figure 5:
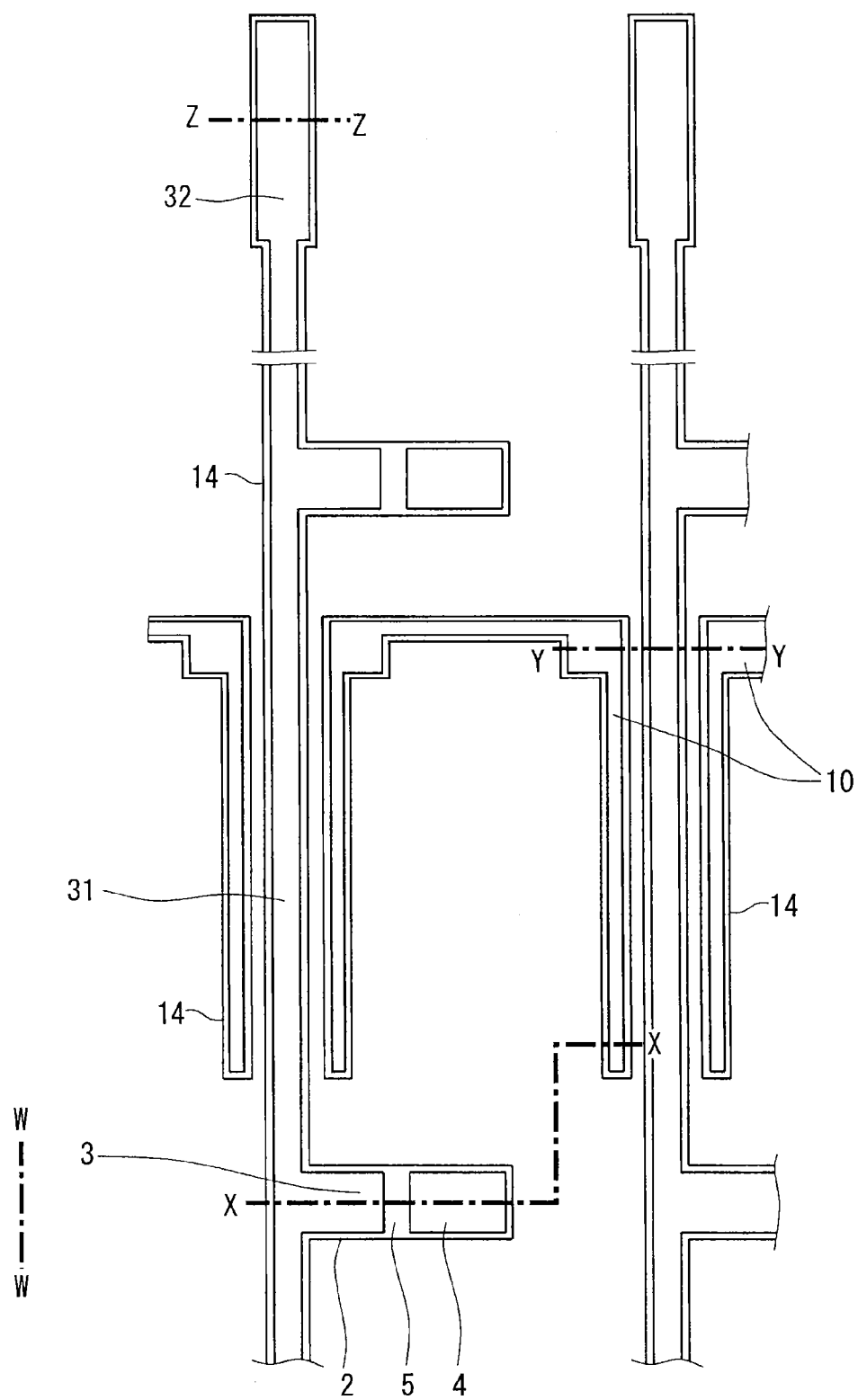
FIG. 5 is a plan view at the stage where the source electrode and the drain electrode have been patterned in the description of the manufacturing method for a thin film transistor substrate in the first preferred embodiment according to the present invention.

FIG. 5 shows a plan view of this state. In FIG. 5, lower layer films of the source line 31, the source terminal 32 and the auxiliary capacitance electrode 10 are pattered with the semiconductor film 14 made of the same material as the semiconductor film 2, and the source line 31, the source terminal 32 and the auxiliary capacitance electrode 10 are pattered with the metal film made of the same material as the source electrode 3 and the drain electrode 4.

The steps up to here will be further described with reference to FIGS. 6 to 11 as sectional views sequentially showing the manufacturing process.

First, the surface of the substrate 1 is cleaned with a cleaning solution or pure water. It is to be noted that herein, a glass substrate with a thickness of 0.6 mm is used as the substrate 1.

Figure 6:
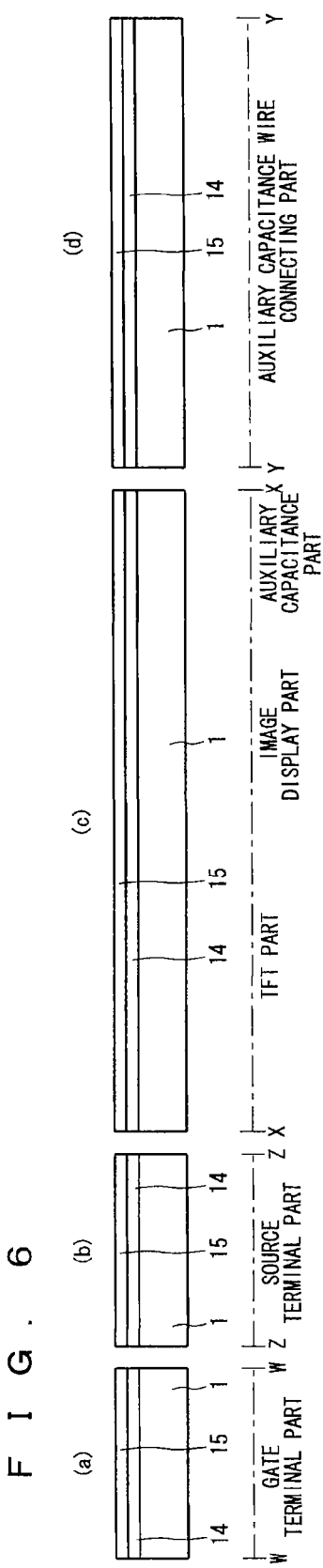
FIGS. 6 to 12 are sectional views each describing the manufacturing method for a thin film transistor in the first preferred embodiment according to the present invention.

An oxide semiconductor film 14 is formed on the cleaned substrate 1 by sputtering by means of an oxide (hereinafter referred to as IGZO) target having a noncrystalline structure in the step shown in FIG. 6. Herein used is an IGZO target with an atomic composition ratio of In (indium):Ga (gallium):Zn (zinc):O (oxygen) being 1:1:1:4.

In this case, the atomic composition ratio of oxygen is smaller than a stoichiometric composition of the target in conventional sputtering using Ar gas, which may result in formation of an oxide film in an oxygen-ion deficient state (the composition ratio of O being smaller than 4 in the above example). It is therefore preferable to perform sputtering with oxygen ($O_2$) gas mixed in Ar gas. In the present preferred embodiment, a mixed gas obtained by adding $O_2$ gas to Ar gas in a partial pressure ratio of 10% is used to perform sputtering, and the oxide semiconductor film 14 with a thickness of 50 nm is formed.

Next, using an Al-3 mol % Ni alloy target added with 3 mol % of Ni, as a first metal film 15, an Al-3 mol % Ni alloy film is formed with a thickness of 200 nm by sputtering using known Ar gas.

Figure 7:
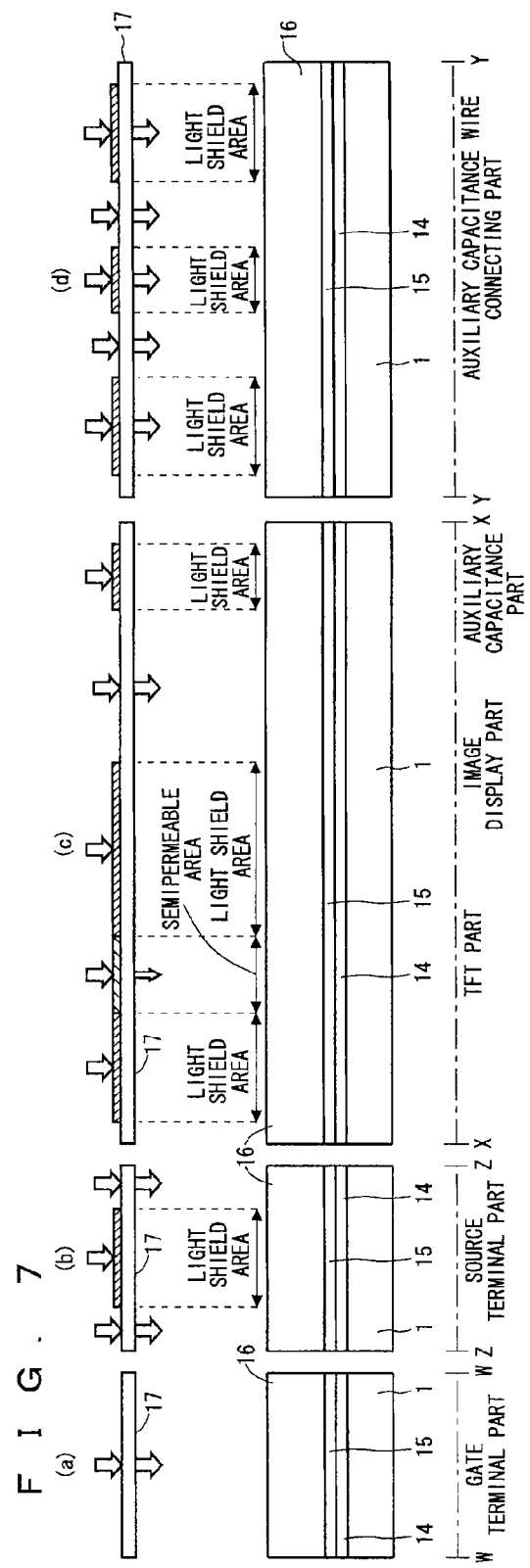

Subsequently, a photo resist pattern is formed on the first metal film 15 in a first photolithography step shown in FIG. 7.

First, a photoresist member including a novolac positive photosensitive resin is applied onto the first metal film 15 by means of an application method, to form a photoresist 16 with a thickness of about 1.5 μm. Next, the photoresist 16 is exposed by means of a previously prepared photomask 17. The photomask 17 is formed with a light shield film pattern for forming patterns of the semiconductor film, the source electrode, the drain electrode, the source line, the source terminal and the auxiliary capacitance electrode in the TFT. An area where exposure light is shielded by this light shield film pattern becomes a light shield area. Further, the photomask 17 is formed with a semipermeable pattern that reduces light intensity of the exposure light in a portion to serve as the channel part of the TFT, and an area where the exposure light is attenuated by this semipermeable pattern becomes a semipermeable area.

Figure 8:
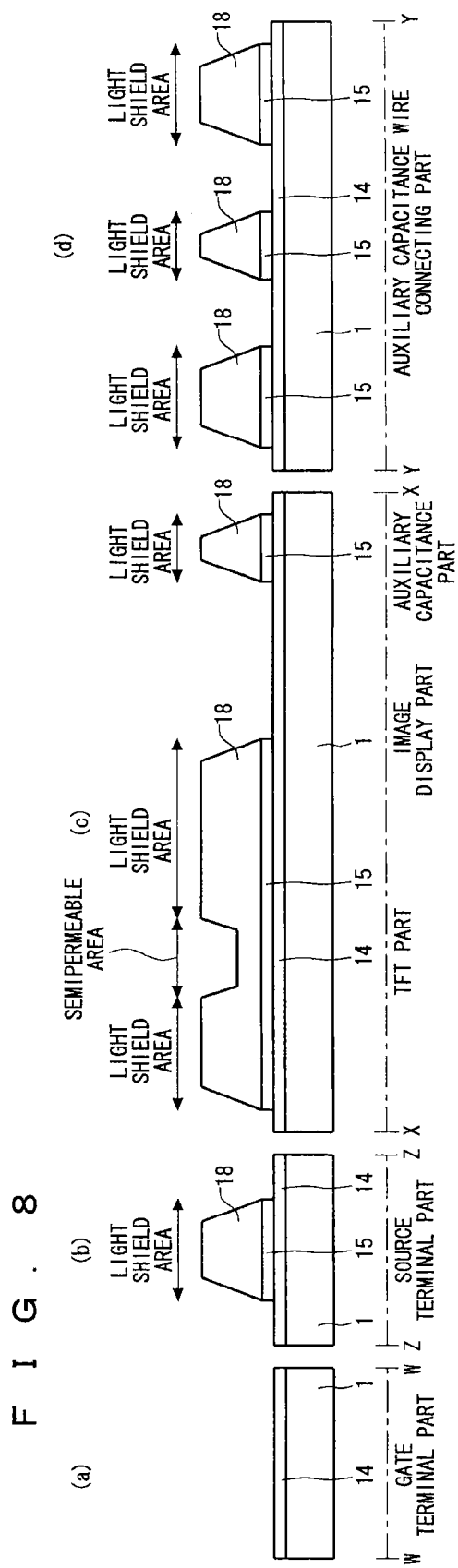

After exposure of the photoresist 16 by means of the photomask 17, development is performed using an organic alkaline developer containing tetramethylammonium hydroxide (TMAH). This can lead to formation of a photoresist pattern 18 for forming the semiconductor film 2, the source electrode 3, the drain electrode 4, the channel part 5, the source line 31, the source terminal 32 and the auxiliary capacitance electrode 10 in the TFT, as shown in FIG. 8. As for this photoresist pattern 18, a photoresist with a smaller film thickness remains in the area corresponding to the channel part of the TFT, having been exposed by means of the semipermeable photomask pattern, than in an unexposed area. In the present preferred embodiment, the photoresist is made to remain with a film thickness of about 0.5 μm. Further, at this time, the first metal film 14 is simultaneously patterned by etching with the photoresist pattern 18 used as the mask by means of the above developer. That is, the development of the photoresist pattern 18 and the etching of the first metal film 15 are performed in the same step.

In the case of using an alkaline solution with a concentration of 2.4 wt % of TMAH as the developer at a normal temperature (23° C.), the Al-3 mol % Ni film is etched at a rate of about 1.5 nm/sec. This can further extend the exposure time by not shorter than 133 seconds after development of the photoresist, so as to completely remove the Al-3 mol % Ni film with a thickness of 200 nm by etching. In this manner, using the developer for the photoresist pattern 18 as an etching solution for the first metal film 15 can simplify the manufacturing process.

It is to be noted that in the case of the positive photoresist, although the exposed portion is degenerated and dissolved by a resist developer, the light-shielded portion is not dissolved by the resist developer, and the photoresist pattern is not influenced in a large degree even when the development processing is extended to a certain extent after the lapse of a predetermined development time (typically from 60 to 120 seconds).

In addition, the foregoing extended development time is time calculated for etching the Al-3 mol % Ni film with a thickness of 200 nm. It is practically desirable to perform processing in time on the order of 1.25 to three times as long as the above time (25% to 200% of over etching time) in consideration of an etching rate and variations in film thickness, and its upper limit is the order of about 400 seconds (399 seconds).

As disclosed in Japanese Patent Application Laid-Open No. 2008-72011, a variety of oxide semiconductor films 14 including the IGZO film used in the present preferred embodiment are highly soluble to an acid solution. It is thus known that the oxide semiconductor film 14 and the metal film 15 cannot be subjected to selective etching, and the pattern processing is thus highly difficult. However, these oxide semiconductor films 14 are not soluble to an alkaline solution such as TMAH. For this reason, using the organic alkaline developer allows removal of only the Al-3 mol % Ni film 15 in the upper layer by etching, without etching of the oxide semiconductor film 14. It is thus possible to improve pattern processing accuracy.

Further, there has hitherto been a problem in that, when the oxide film such as the IGZO film is laminated, or brought into contact, with Al metal, a cell reaction with both layers taken as electrodes occurs in development in the organic alkaline developer for a photoresist, to bring about oxidation corrosion of the Al metal and reductive corrosion of the IGZO film, leading to occurrence of a pattern failure.

However, as in the present preferred embodiment, etching the Al-3 mol % Ni film, obtained by adding Ni to Al, in the alkaline developer can prevent the cell reaction which has been problematical with the conventional Al metal. It is therefore possible to perform favorable selective etching without bringing about reductive corrosion of the IGZO film.

Figure 9:
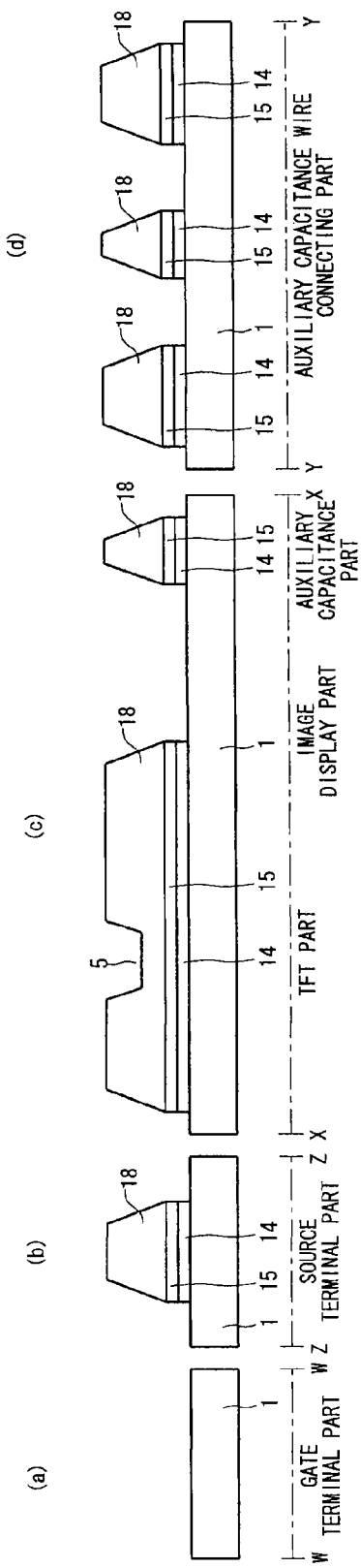

Next, in a step shown in FIG. 9, the oxide semiconductor film 14 is patterned by etching with the photoresist pattern 18 used as the mask. In this etching step, an aqueous solution with a concentration of 5 wt % of oxalic acid is used. In this case, the IGZO oxide semiconductor film is etched at a rate of about 1 nm/sec at a normal temperature (23° C.). It is to be noted that the first metal film 15 including Al-3 mol % Ni is insoluble not only to the foregoing oxalic acid aqueous solution, but to a generally known oxalic acid aqueous solution. For this reason, it is possible to selectively etch only the oxide semiconductor film including IGZO, so as to improve pattern processing accuracy.

By this etching, the lower layer films of the semiconductor film 2, the source line 31, the source terminal 32 and the auxiliary capacitance electrode 10 are patterned.

Figure 10:
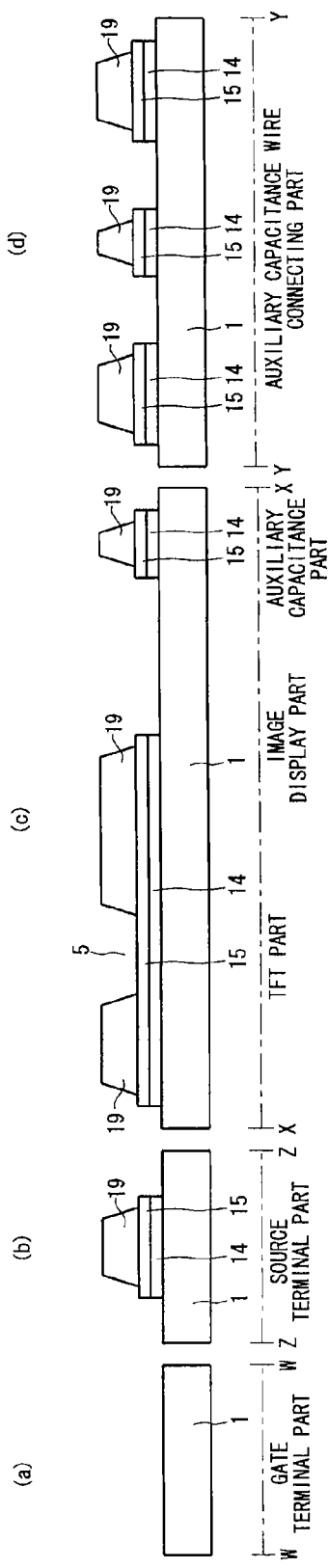

Next, in a step shown in FIG. 10, resist ashing is performed on the surface of the substrate 1 by means of oxygen gas plasma. This resist ashing is performed such that only the photoresist in the area with a small thickness corresponding to the channel part of the TFT is removed, and the photoresist in the other unexposed area is made to remain. Thereby, in the area other than the area corresponding to the channel part, the photoresist pattern 18 becomes thinner to come to serve as a photoresist pattern 19.

Figure 11:
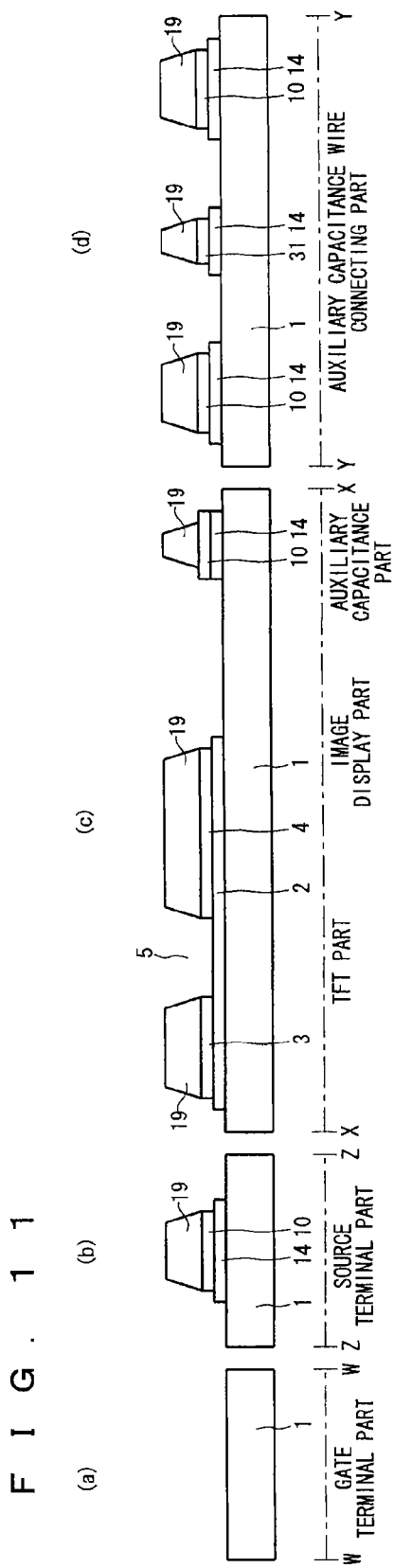

Next, in a step shown in FIG. 11, only the first metal film 15 is selectively etched by means of an alkaline developer with a concentration of 2.4 wt % of TMAH again, with the photoresist pattern 19 used as the mask. The first metal film 15 in the area corresponding to the channel part of the TFT is thereby removed (back channel etching), to define the channel part 5 of the TFT. Subsequently, peeling and removing the resist pattern 19 by means of an amine resist peeling solution forms on the substrate 1 the patterns of the semiconductor film 2, the source electrode 3, the drain electrode 4, the channel part 5, the source line 31, the source terminal 32 and the auxiliary capacitance electrode 10 in the TFT, as shown in FIGS. 4 and 5.

Figure 12:
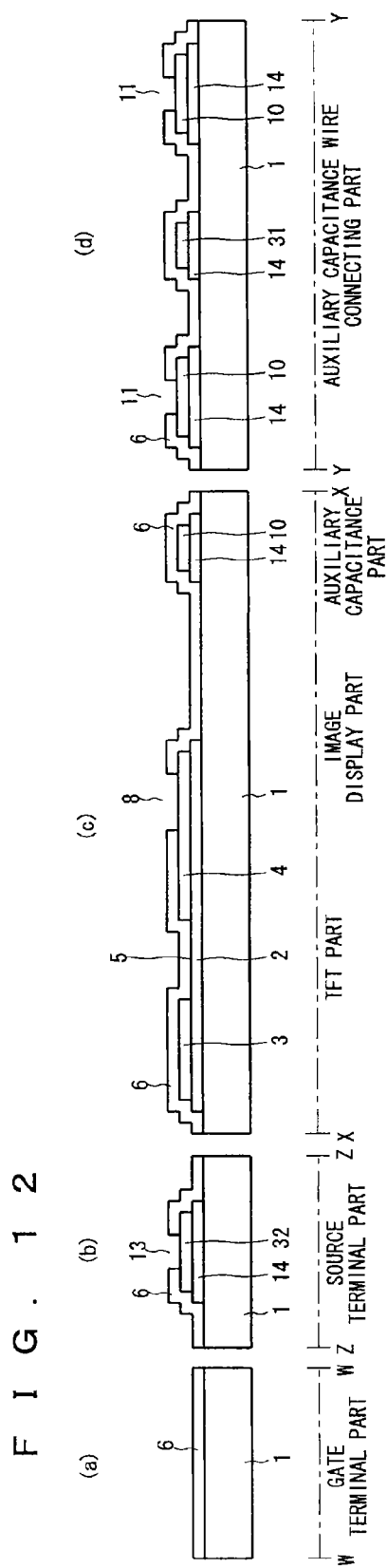

Next, in a step shown in FIG. 12, for example, the gate insulating film 6 is formed using chemical vapor deposition (CVD), for example. Specifically, a nitride silicon (SiN) film with a thickness of 300 nm is formed under a substrate heating condition of about 250° C.

Figure 13:
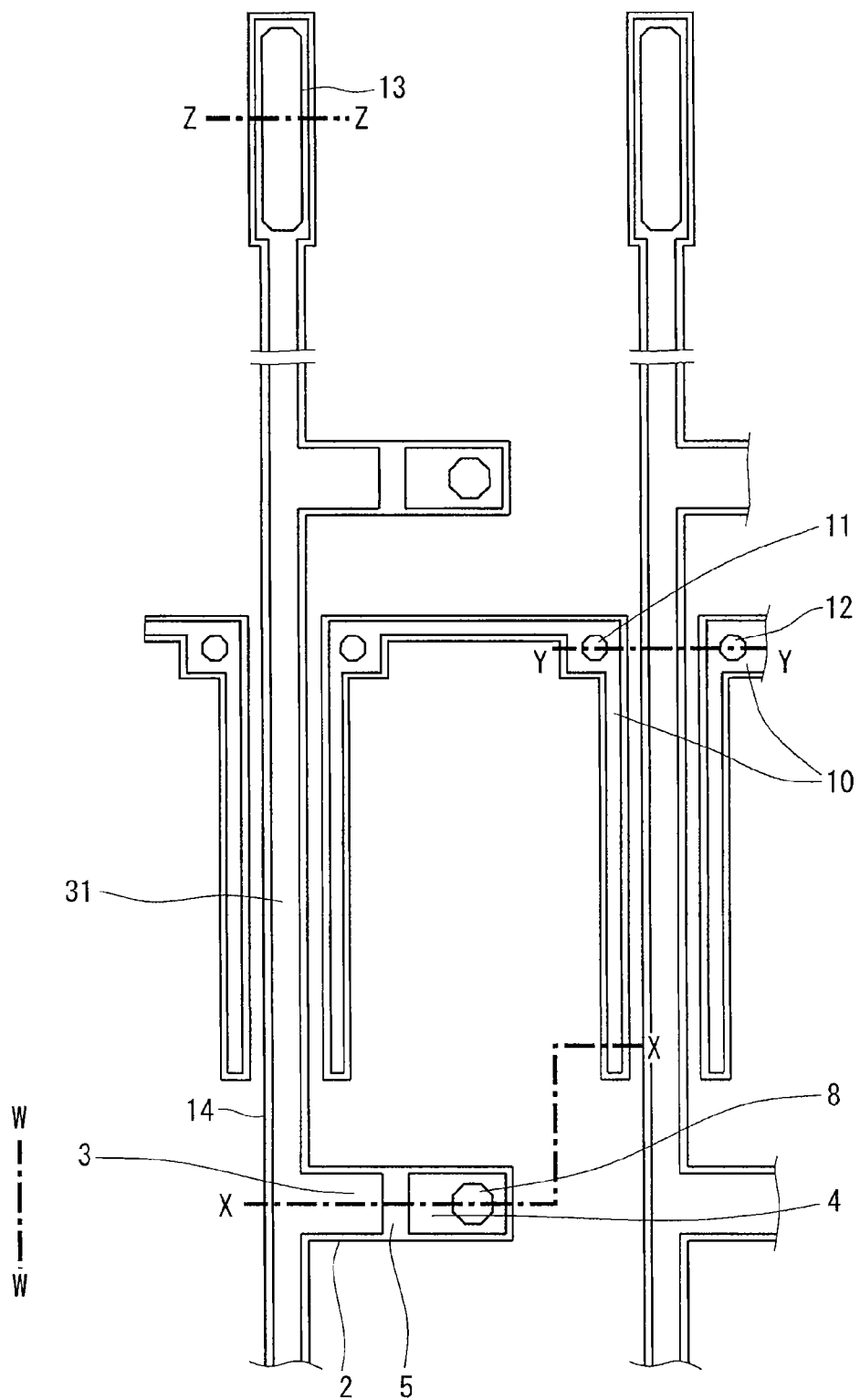
FIG. 13 is a plan view describing the manufacturing method for a thin film transistor in the first preferred embodiment according to the present invention.

Subsequently, a photo resist pattern is formed in a second photolithography step, to pattern the SiN film. That is, the photo resist pattern is used as the mask, to etch the SiN film. In this etching step, dry etching by means of known fluorine gas is used. Thereby, the pixel drain contact hole 8 is formed on the drain electrode 4, the contact hole 11 for connection between auxiliary capacitance electrodes is formed on the auxiliary capacitance electrode 10, and the contact hole 13 in the source terminal part is formed on the source terminal 32. Subsequently, the photo resist pattern is removed, thereby to allow formation of the gate insulating film 6 having a plurality of contact holes 8, 11, 13, as shown in FIG. 12 and FIG. 13.

Figure 14:
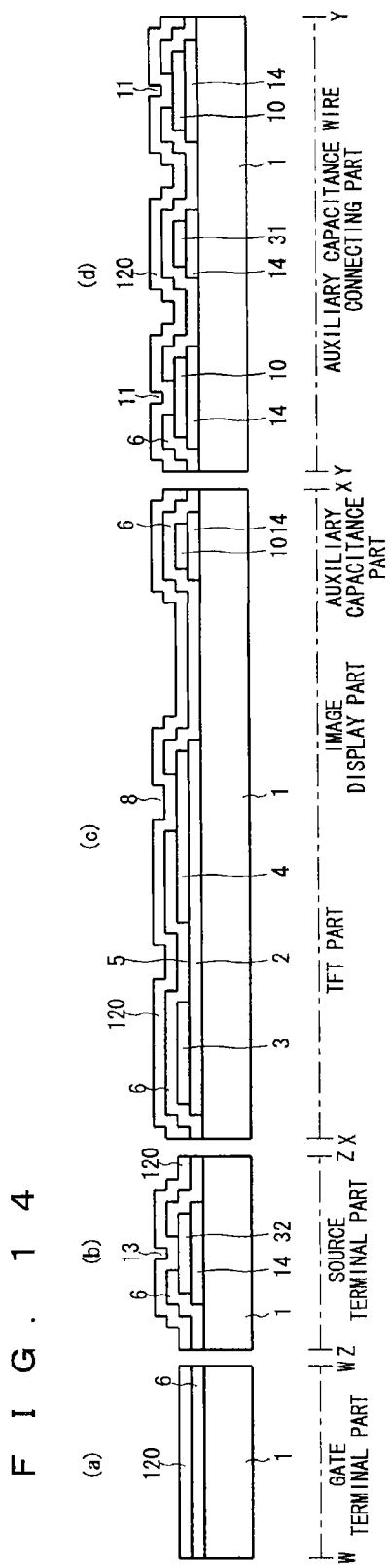
FIG. 14 is a sectional view describing the manufacturing method for a thin film transistor in the first preferred embodiment according to the present invention.

Next, in a step shown in FIG. 14, a transparent conductive film 120 is formed as the second conductive film. In the present preferred embodiment, an IZO (indium oxide $In_2O_3$+ oxide zinc ZnO) film as the transparent conductive film 120 is formed with a thickness of 100 nm by sputtering using known Ar gas.

Figure 15:
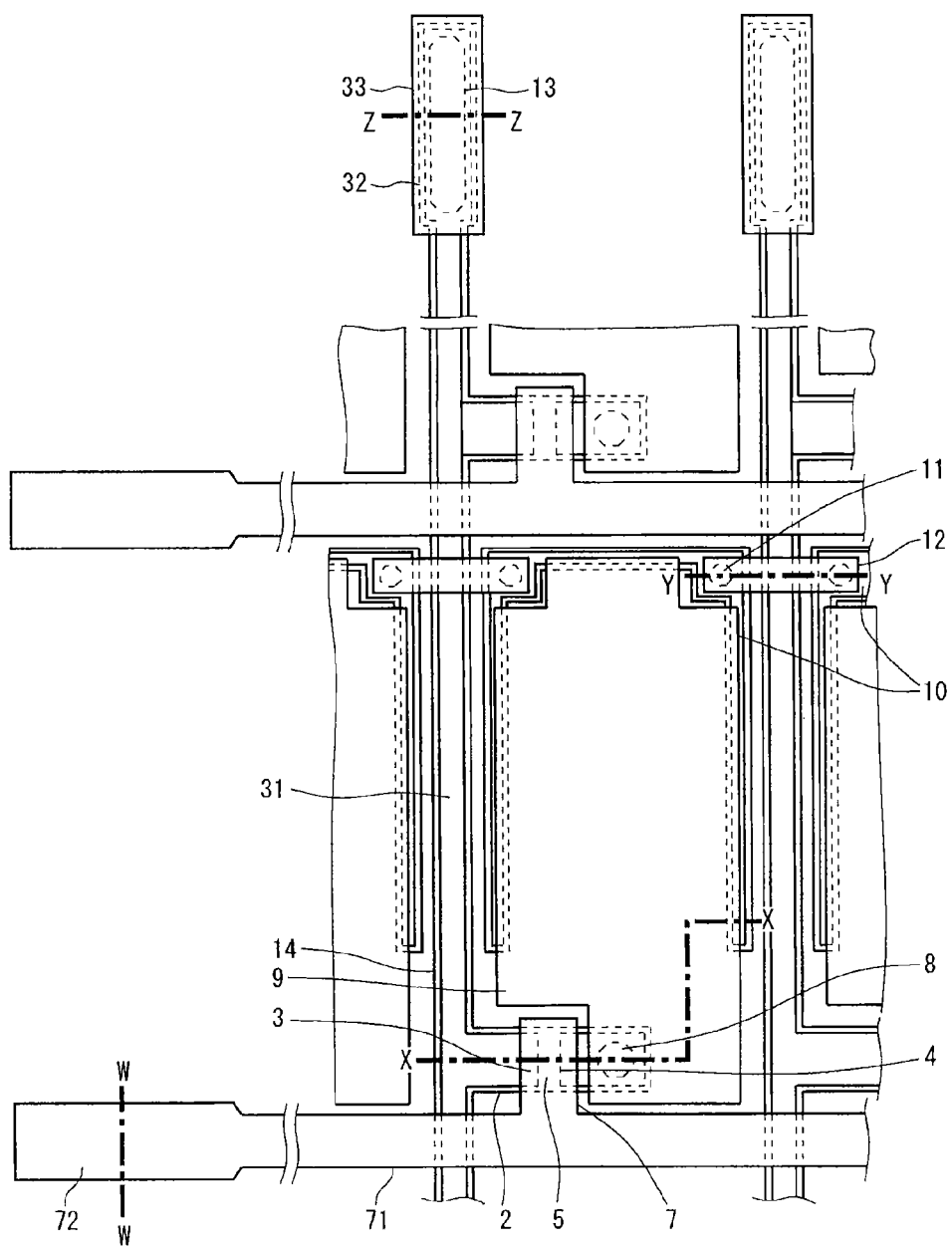
FIG. 15 is a plan view schematically showing the plane configuration of the thin film transistor substrate in the first preferred embodiment according to the present invention.
Figure 16:
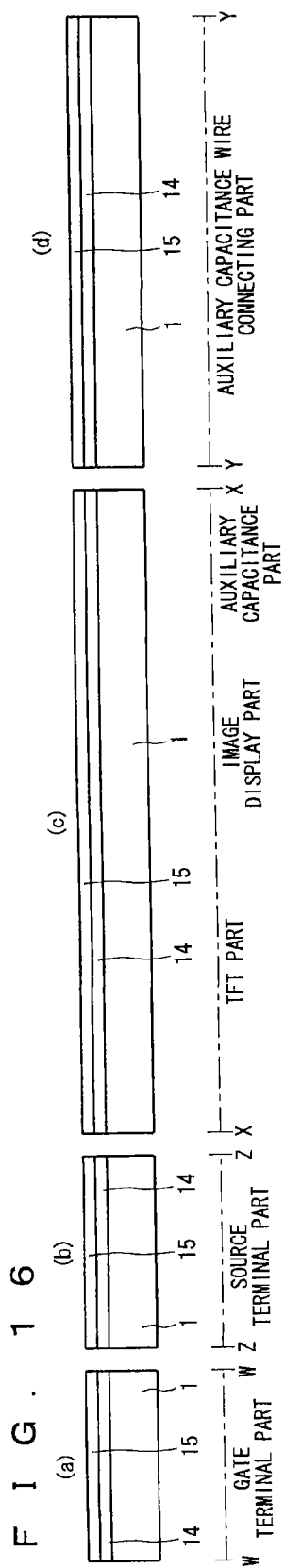
FIGS. 16 to 22 are sectional views each describing a manufacturing method for a thin film transistor in a second preferred embodiment according to the present invention.

Subsequently, a photo resist pattern is formed in a third photolithography step, to etch the IZO film 120 with the photo resist pattern used as the mask. This leads to formation of the gate electrode 7, the pixel electrode 9, the auxiliary capacitance connecting line 12, and the source terminal pad 33, as shown in FIGS. 3 and 15. In this etching step, wet etching by means of a known oxalate solution can be performed. After the etching, the photo resist pattern is removed.

As described above, according to the manufacturing method for a TFT substrate according to the present preferred embodiment, it is possible to obtain the TFT substrate 200 only by three times of photolithography steps.

An alignment film and a spacer are formed on the surface of the completed TFT substrate 200. The alignment film includes polyimide or the like for arraying liquid crystal. Further, a counter substrate provided with a color filter and an alignment film is prepared, and the TFT substrate 200 and the counter substrate are bonded to each other. A gap is then formed between the substrates by means of the spacer, and liquid crystal is injected and held therein. Further, a polarizing plate, an optical retardation plate, a back light unit and the like are disposed outside both substrates. The liquid crystal display can thereby be completed.

<Effect>

Light from the back light unit is directly incident on the semiconductor film since the semiconductor film 2 of the TFT is formed in the lowermost layer on the TFT substrate of the completed liquid crystal display. However, since the IGZO oxide semiconductor film is used as the semiconductor film 2, it is possible to realize the TFT substrate that is influenced in a small degree by deterioration in ON/OFF ratio of TFT characteristics due to generation of the photo carrier as in the case of using Si for the semiconductor film 2.

This eliminates the need for forming the light shield film between the foundation substrate and the semiconductor film 2, thereby allowing realization of the liquid crystal display having high display quality with a high contrast ratio and no display inconsistencies without incurring an increase in manufacturing process for forming the light shield film.

Further, since the TFT substrate using a highly mobility oxide semiconductor film can be realized, it is possible to manufacture a TFT substrate with a high operation rate, and a liquid crystal display using that TFT substrate with a high production yield.

Naturally, the TFT substrate according to the present invention may be used for a display other than the liquid crystal display. For example, it can be used for an electro-optic display such as an organic EL (electroluminescence) display.

Further, it can also be used for a thin film transistor and an active matrix substrate which are used for semiconductor components and the like other than the display.

Moreover, in the present preferred embodiment, using the Al-3 mol % Ni film as the first metal film 15 allows etching in the organic alkaline medical solution at a relatively fast etching rate. For this reason, simultaneously with exertion of the effect of allowing selective etching without causing damage on the oxide (or nitride) semiconductor film in the lower layer, electric ohmic contact characteristics with the oxide semiconductor film 2 can be made favorable without occurrence of the problem of deterioration in ohmic contact characteristics of a typical AL film due to its contact with the oxide semiconductor film 2.

Further, it is also possible to make more favorable the contact characteristics with the transparent conductive film (pixel electrode 9, source terminal pad 33) including the IZO film in the upper layer formed in contact with the first metal film 15, and the like.

MODIFIED EXAMPLE

It should be noted that the material for the first metal film 15 is not restricted to the Al-3 mol % Ni film. For example, the element to be added to Al is not restricted to N, but may be palladium (Pd) or platinum (Pt) belonging to the same group 10 element in the periodic law.

Further, not less than two of these Ni, Pd and Pt may be added to Al. Adding these elements to Al allows etching without corrosion of the IGZO film with an alkaline solution (developer) containing TMAH.

Further, the additive amount is not restricted to 3 mol %. If it is not smaller than 0.5 mol %, etching can be performed by an alkaline solution containing TMAH. It is to be noted that, when the additive amount exceeds 10 mol %, the rate of deposition of compound phases of AlNi, AlPd and AlPt in the Al alloy film increases, and these may be left unetched by the alkaline developer, to bring about an etching failure. Hence it is desirable to set a total additive amount of Ni, Pd and Pt, which are added with Al, to not smaller than 0.5 mol % and not larger than 10 mol %. In this manner, it is possible to improve the rate of etching by the organic alkaline developer, so as to facilitate etching.

Further, it is possible to set the TMAH concentration in the TMAH solution not only to 2.4 wt % but also to the range of not lower than 0.2 wt % and not higher than 25 wt % with a solution temperature being from 10° C. to 50° C. for example. When the TMAH concentration is lower than 0.2 wt %, an etching rate significantly decreases even in the case of the above Al alloy film, to make etching difficult to perform. On the other hand, when the TMAH concentration is higher than 25 wt %, damage on a photo resist pattern 16 increases, which may bring about a pattern failure.

It is to be noted that, even when the TMAH concentration is not 2.4 wt %, such an effect remains unchanged that the contact characteristics with the transparent conductive film (pixel electrode 9, source terminal pad 33) including the oxide semiconductor film 2 in the lower layer, the IZO film in the upper layer and the like is also made favorable.

Further, the first metal film 15 in contact with the oxide semiconductor film 14 may includes the Al film. In this case, N atoms or O atoms are added to the Al film. The N atoms or the O atoms can be added by means of reactive sputtering.

For example, the reactive sputtering is performed using a mixed gas obtained by adding $N_2$ gas or $O_2$ gas to Ar gas. This allows addition of the N atoms or the O atoms to the Al film.

Additive amounts of the N atoms and the O atoms are preferably held in a range where the Al film has conductivity. For example, when an upper limit of a specific resistance value is set to not higher than 200 μΩcm with the value of a film of Ti, Cr, Mo, Ta or W, which has hitherto been typically used for the electrode film or the value of an alloy of these taken as a reference, it is preferable to make the N atoms not larger than 40 at % and the O atoms not larger than 15 at %.

Further, both the N atoms and the O atoms are added in the range not exceeding 200 μΩcm. Also in this case, it is possible to obtain a similar effect to the foregoing preferred embodiment.

Moreover, the N atoms or the O atoms may further be added to the forgoing Al alloy film containing Ni, Pd or Pt. Turning the Al film or the Al alloy film to the conductive film containing the N atoms or the O atoms in this manner can make the electric ohmic contact characteristics favorable. That is, it is possible to make favorable the contact characteristics with the oxide semiconductor film 2 in the lower layer and the contact characteristics with the transparent conductive film (pixel electrode 9, source terminal pad 33) including the IZO film in the upper layer, and the like, so as to improve the TFT characteristics and the display characteristics of the pixels.

It should be noted that the additive amounts of the N atoms and the O atoms can be controlled by adjusting partial pressure of $N_2$ gas and $O_2$ gas.

As thus described, such a configuration is adopted that, the source electrode and the drain electrode, which include the Al film or the Al alloy film and formed on the oxide semiconductor film 14 while at least being in contact therewith, are Al films having conductive aluminum containing nitrogen or a film mainly containing this at least on the surface in contact with the oxide semiconductor film 14, whereby it is possible to obtain the effect of being capable of performing selective etching without causing damage on the oxide (or nitride) semiconductor film in the lower layer as in the first preferred embodiment. Further, it is possible to solve the problem of deterioration in ohmic contact characteristics of the typical Al film due to its contact with the oxide semiconductor film 2 (or nitride semiconductor film), so as to make favorable the contact characteristics with the oxide semiconductor film 2 (or nitride semiconductor film) in the lower layer and with the transparent conductive film (pixel electrode 9, source terminal pad 33) including the IZO film in the upper layer, and the like.

Second Preferred Embodiment

The example has been described in above described the first preferred embodiment where the first conductive film 15 includes the Al alloy film, but in the TFT substrate 200 according to a second preferred embodiment, the first conductive film 15 includes a Cu film or a Cu alloy film mainly containing Cu. Hereinafter, the Cu film and the Cu alloy film mainly containing Cu are collectively called a Cu film. In addition, other than the above, the same configuration as in the first preferred embodiment is provided with the same numeral, and a repeated description will be omitted.

<Manufacturing Method for TFT Substrate>

Next, a manufacturing method for the TFT substrate 200 according to the second preferred embodiment will be described using FIGS. 4, 5 and 16 to 22. It is to be noted that a sectional view showing a final step corresponds to FIG. 3, and each of the parts (a) to (d) in FIG. 3 indicates the same portion in each sectional view describing the manufacturing process in the following descriptions.

First, as shown in the part (c) in FIG. 4, the semiconductor film 2 is patterned in the TFT part on the substrate 1, and the source electrode 3 and the drain electrode 4 are patterned thereon. In the steps up to here, the source terminal 32 is formed in the source terminal part as shown in the part (b) in FIG. 4, the auxiliary capacitance electrode 10 and the source line 31 are formed in the auxiliary capacitance line connecting part as shown in the part (d) in FIG. 4, and the auxiliary capacitance electrode 10 is formed in the auxiliary capacitance part 209 as shown in the part (c) in FIG. 4.

FIG. 5 shows a plan view of this state. In FIG. 5, lower layer films of the source line 31, the source terminal 32 and the auxiliary capacitance electrode 10 are pattered with the semiconductor film 14 made of the same material as the semiconductor film 2, and the source line 31, the source terminal 32 and the auxiliary capacitance electrode 10 are pattered with the metal film made of the same material as the source electrode 3 and the drain electrode 4.

The steps up to here will be further described with reference to FIGS. 16 to 22 as sectional views sequentially showing the manufacturing process.

First, the surface of the substrate 1 is cleaned with a cleaning solution or pure water. It is to be noted that herein, a glass substrate with a thickness of 0.6 mm is used as the substrate 1. An oxide semiconductor film 14 is formed on the cleaned substrate 1 by sputtering by means of an oxide (hereinafter referred to as IGZO) target having a noncrystalline structure in the step shown in FIG. 16. Herein used is an IGZO target with an atomic composition ratio of In (indium):Ga (gallium):Zn (zinc):O (oxygen) being 1:1:1:4.

In this case, the atomic composition ratio of oxygen is smaller than a stoichiometric composition of the target in conventional sputtering using Ar gas, which may result in formation of an oxide film in an oxygen-ion deficient state (the composition ratio of O being smaller than 4 in the above example). It is therefore preferable to perform sputtering with oxygen ($O_2$) gas mixed in the Ar gas. In the present preferred embodiment, a mixed gas obtained by adding $O_2$ gas to Ar gas in a partial pressure ratio of 10% is used to perform sputtering, and the oxide semiconductor film 14 with a thickness of 50 nm is formed.

Next, a pure Cu film is formed by sputtering as the first metal film 15. In this sputtering, a pure Cu film with a thickness of 200 nm is formed using pure Ar gas.

Figure 17:
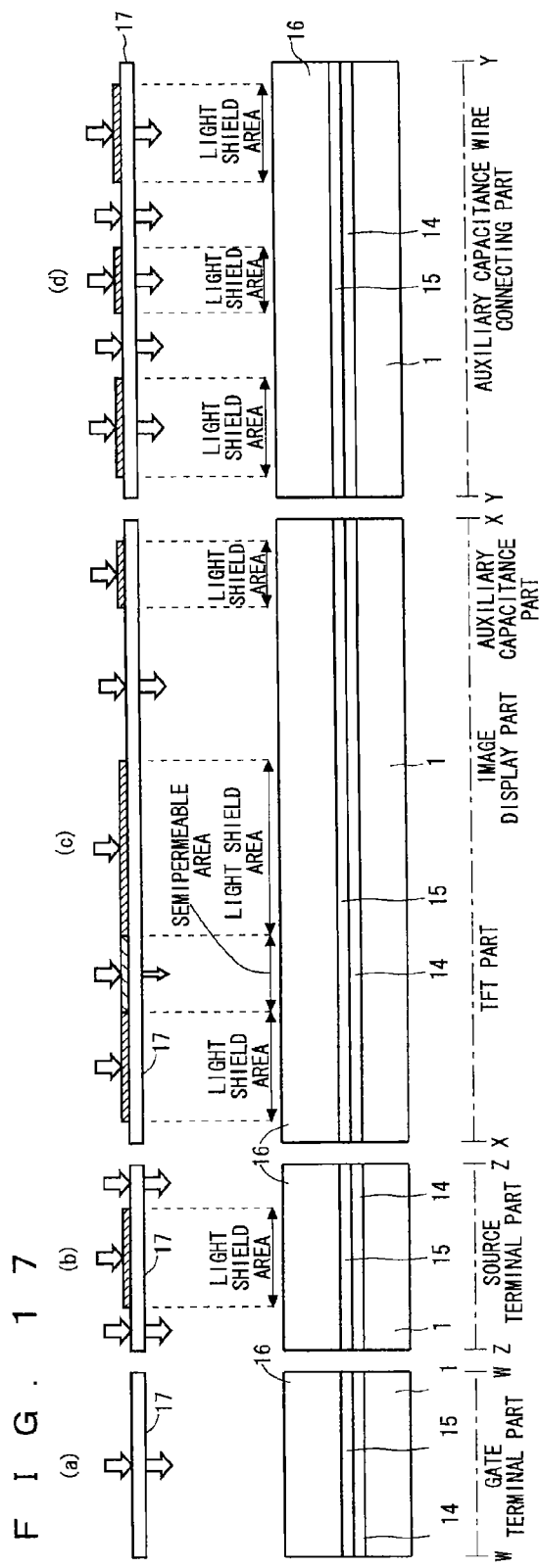

Subsequently, a photo resist pattern is formed on the first metal film 15 in a first photolithography step shown in FIG. 17.

First, a photoresist member including a novolac positive photosensitive resin is applied onto the first metal film 15 by an application method, to form a photoresist 16 with a thickness of about 1.5 μm. Next, the photoresist 16 is exposed by means of a previously prepared photomask 17. The photomask 17 is formed with a light shield film pattern for forming patterns of the semiconductor film, the source electrode, the drain electrode, the source line, the source terminal and the auxiliary capacitance electrode film in the TFT. An area where exposure light is shielded by this light shield film pattern becomes a light shield area. Further, the photomask 17 is formed with a semipermeable pattern that reduces light intensity of the exposure light in a portion to serve as the channel part of the TFT, and an area where the exposure light is attenuated by this semipermeable pattern becomes a semipermeable area.

Figure 18:
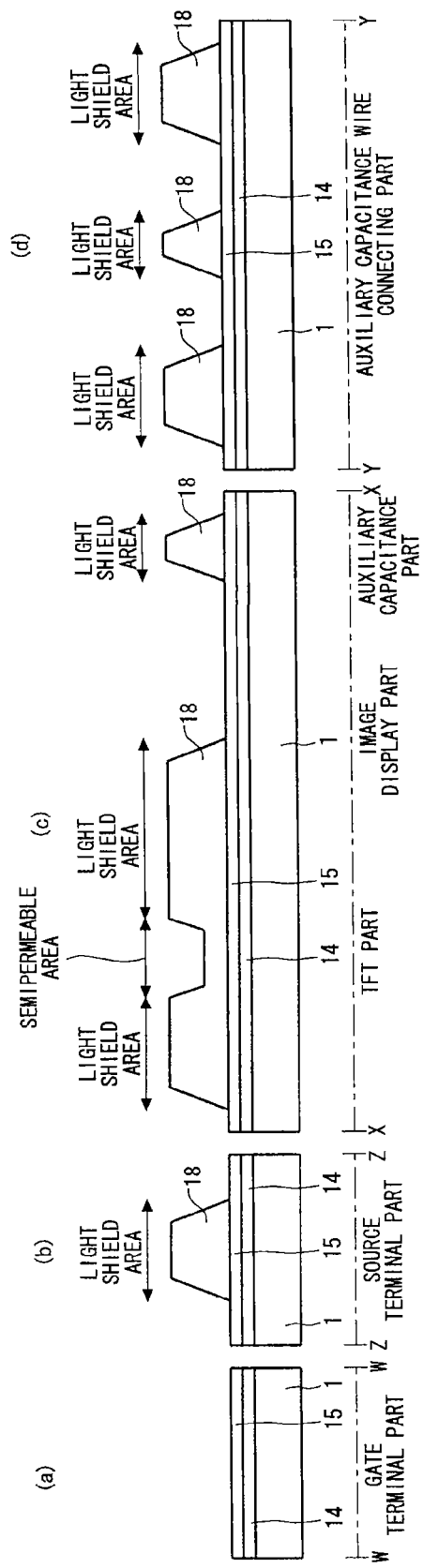

After exposure of the photoresist 16 by means of the photomask 17, development is performed using an organic alkaline developer containing tetramethylammonium hydroxide (TMAH). This can lead to formation of a photoresist pattern 18 for forming the semiconductor film 2, the source electrode 3, the drain electrode 4, the channel part 5, the source line 31, the source terminal 32 and the auxiliary capacitance electrode 10 in the TFT, as shown in FIG. 18.

As for this photoresist pattern 18, a photoresist with a smaller film thickness remains in the area corresponding to the channel part of the TFT, having been exposed by means of the semipermeable photomask pattern, than in an unexposed area. In the present preferred embodiment, the photoresist is made to remain with a film thickness of about 0.5 μm.

Figure 19:
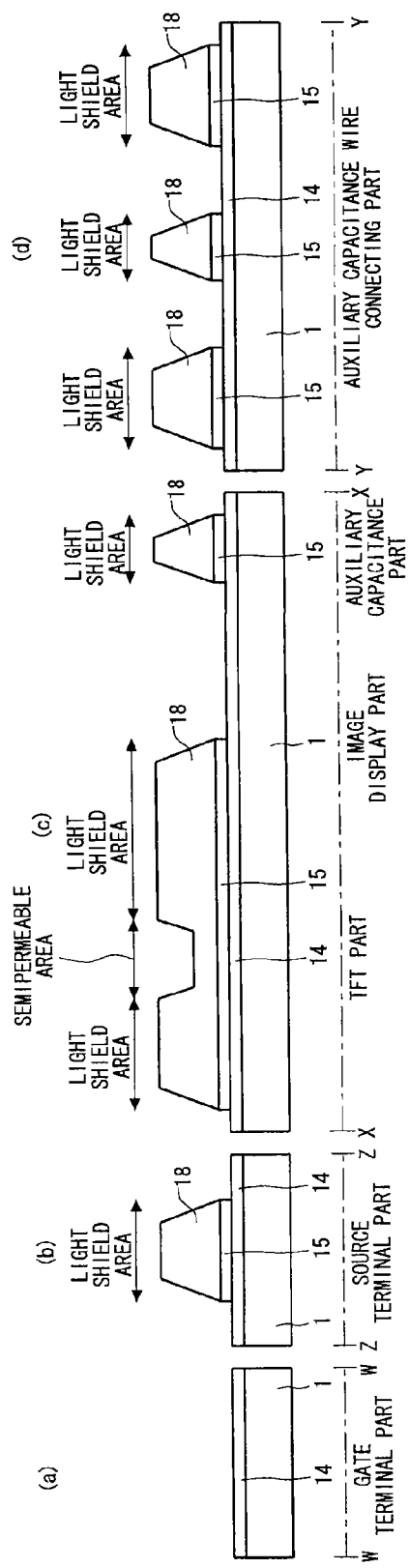

Next, in a step shown in FIG. 19, the first conductive film 15 is patterned by etching with the photoresist pattern 18 used as the mask. In this etching, a solution containing an aqueous solution with 0.3 wt % of ammonium persulfate and having a solution temperature of 23° C. is used as an etchant. In this case, the first metal film 15 including the pure Cu film is etched at a rate of about 1 nm/sec. On the other hand, the oxide semiconductor film 14 including IGZO is resistant to etching by an ammonium persulfate solution. It is thus possible to selectively etch only the first conductive film 15 including Cu by using the solution containing ammonium persulfate as shown in FIG. 19

Figure 20:
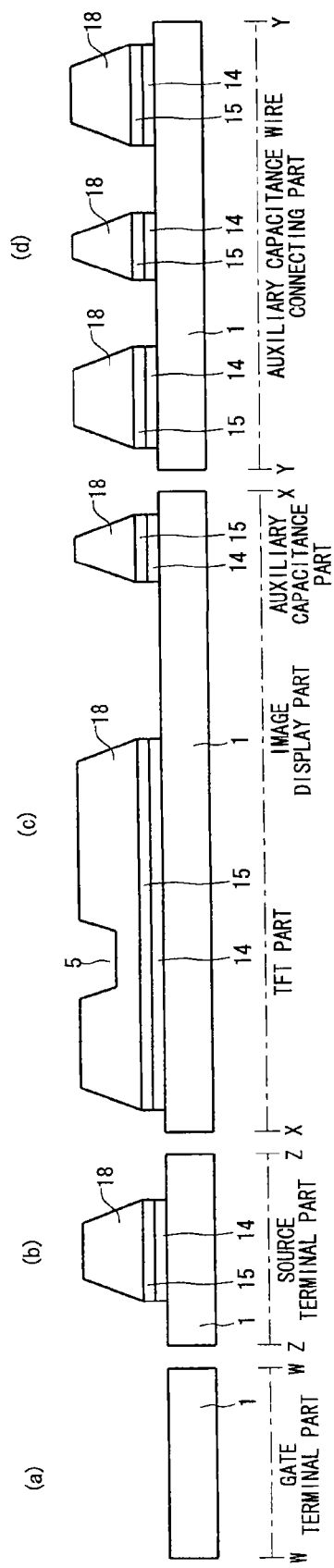

Next, in a step shown in FIG. 20, the oxide semiconductor film 14 is patterned by etching with the photoresist pattern 18 used as the mask. In this etching step, an aqueous solution with a concentration of 5 wt % of oxalic acid is used. In this case, the IGZO oxide semiconductor film is etched at a rate of about 1 nm/sec at a normal temperature (23° C.). It is to be noted that the first metal film 15 including the Cu film or the Cu alloy film mainly containing Cu is insoluble not only to the foregoing oxalic acid aqueous solution, but to a generally known oxalic acid aqueous solution. For this reason, it is possible to selectively etch only the oxide semiconductor film 14 including IGZO, so as to improve pattern processing accuracy.

By this etching, the lower layer films of the semiconductor film 2, the source line 31, the source terminal 32 and the auxiliary capacitance electrode 10 are patterned.

Figure 21:
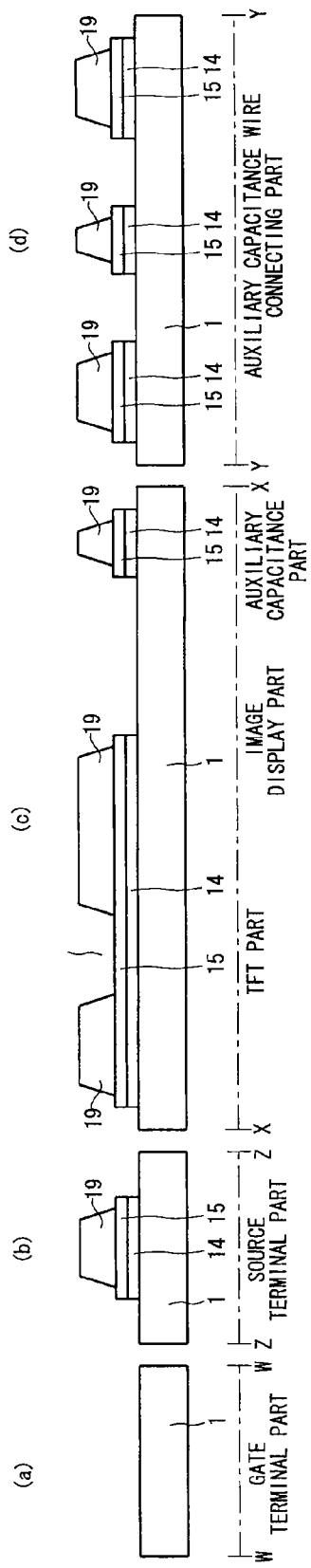

Next, in a step shown in FIG. 21, resist ashing is performed on the surface of the substrate 1 by means of oxygen gas plasma. This resist ashing is performed such that only the photoresist in the area with a small thickness corresponding to the channel part of the TFT is removed, and the photoresist in the other unexposed area is made to remain. Thereby, in the area other than the area corresponding to the channel part, the photoresist pattern 18 becomes thinner to come to serve as a photoresist pattern 19.

Figure 22:
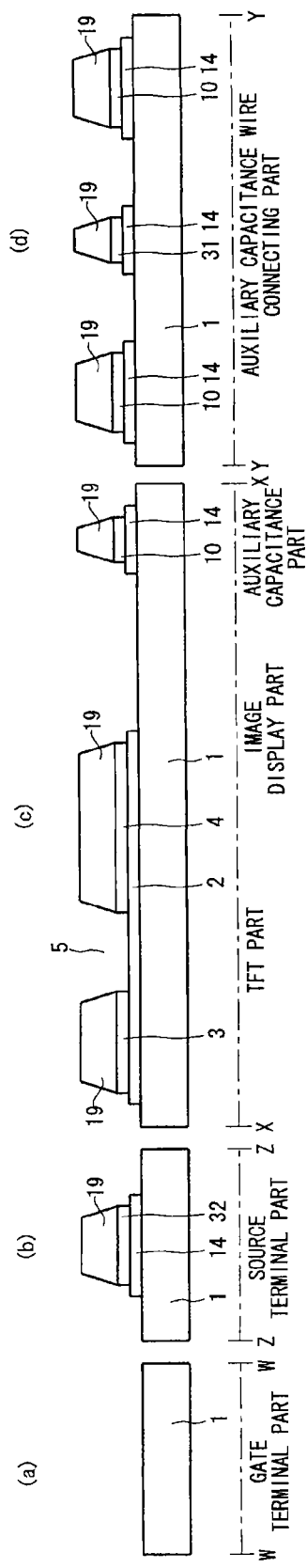

Next, in a step showing FIG. 22, only the first metal film 15 is selectively etched using the solution containing an aqueous solution with 0.3 wt % of ammonium persulfate and having a solution temperature of 23° C., with the photoresist pattern 19 used as the mask. The first metal film in the area corresponding to the channel part of the TFT is thereby removed (back channel etching), to define the channel part 5 of the TFT. Thereafter, peeling and removing the resist pattern 19 by means of an amine resist peeling solution forms on the substrate 1 the patterns of the semiconductor film 2, the source electrode 3, the drain electrode 4, the channel part 5, the source line 31, the source terminal 32 and the auxiliary capacitance electrode 10 in the TFT, as shown in FIGS. 4 and 5.

Subsequently, after the steps described using FIGS. 12 to 14, the gate electrode 7, the pixel electrode 9, the auxiliary capacitance connecting line 12, and the source terminal pad 33 are formed as shown in FIGS. 3 and 15, and it is possible to obtain the TFT substrate 200 only by three times of photolithography steps.

<Effect>

The first conductive film 15 includes the Cu film or the Cu alloy film mainly containing Cu, whereby it is possible to decrease a line resistance value to the order of one-fifth to one-half as large as in the case of the first conductive film 15 being including the Al alloy film. Hence, with a larger size (longer line) and a higher definition having a larger number of pixels (smaller line width) of the display panel, the Cu-system film has a higher margin with respect to deterioration in display quality due to a signal delay (loss of accuracy in video signal waveform, etc.) accompanied by higher resistance of lines in the case of comparison in the same film thickness.

For example, as for the specific resistance value coherent to the material, specific resistance values of the Cu film and a Cu-M alloy film (composition of M being not larger than 10 mol %) are on the order of 1.7 to 5 $\mu\Omega$cm, whereas that of an Al—Ni alloy film (composition of Pt or Pd being not larger than 10 mol %) is on the order of 3.5 to 10 $\mu\Omega$cm.

MODIFIED EXAMPLE

Although pure Cu has been used as the material for the first metal film 15, the material for the first metal film 15 is not restricted to this. For example a Cu alloy film obtained by adding any one of Ti, V, Cr, Mn, Fe and Ni to Cu may be used.

As an upper limit of an additive amount of the additive, not higher than 10 mol % is taken as a guide in consideration of line resistance. Further, a lower limit is set so as to be a minimum amount required for depositing the additives as a surface protective layer by thermal treatment at 200 to 350° C. performed after pattern formation of the Cu alloy film, and for example, when the surface protective film has a film thickness being on the order of 1% of a film thickness of the Cu alloy film (2 nm when the film thickness of the Cu alloy is 200 nm), an atomicity ratio is set to 1 at % (=1 mol %).

These Cu alloy films are subjected to thermal treatment at 200 to 350° C., thereby to deposit an added element on the surface of the Cu alloy film and form a protective film so as to coat the whole surface of the Cu alloy. Hence it is possible to make favorable the contact characteristics with the oxide semiconductor film 2 in the lower layer and the contact characteristics with the transparent conductive film (pixel electrode 9, source terminal pad 33) including the IZO film in the upper layer, and the like.

Further, at least the Cu film or the Cu alloy film in contact with the oxide semiconductor film 14 may be added with the N atoms or the O atoms. The N atoms or the O atoms can be added by means of reactive sputtering.

For example, the reactive sputtering is performed using a mixed gas obtained by adding $N_2$ gas or $O_2$ gas to Ar gas. This allows addition of the N atoms or the O atoms to the Cu alloy film.

Additive amounts of the N atoms and the O atoms are preferably held in a range where the Cu film has conductivity. For example, when an upper limit of a specific resistance value is set to not higher than 200 $\mu\Omega$cm with the value of a film of Ti, Cr, Mo, Ta or W, which has hitherto been typically used for the electrode film or the value of an alloy of these taken as a reference, it is preferable to make the N atoms not larger than 40 at % and the O atoms not larger than 15 at %.

Further, both the N atoms and the O atoms may be added in the range not exceeding 200 $\mu\Omega$cm. Also in this case, it is possible to obtain a similar effect to the foregoing first preferred embodiment.

Moreover, the N atoms or the O atoms may further be added to the forgoing Cu alloy film containing any one of Ti, V, Cr, Mn, Fe and Ni. Turning the Cu film or the Cu alloy film to the alloy film containing the N atoms or the O atoms in this manner can make the electric ohmic contact characteristics favorable. That is, it is possible to make favorable the contact characteristics with the oxide semiconductor film 2 in the lower layer and the contact characteristics with the transparent conductive film (pixel electrode 9, source terminal pad 33) including the IZO film in the upper layer, and the like, so as to improve the TFT characteristics and the display characteristics of the pixels.

It should be noted that the additive amounts of the N atoms and the O atoms can be controlled by adjusting partial pressure of $N_2$ gas and $O_2$ gas.

As thus described, such a configuration is adopted that, the source electrode and the drain electrode, which include the Cu film or the Cu alloy film and formed on the oxide semiconductor film 14 while at least being in contact therewith, are Cu films having an alloy film as the Cu film or the Cu alloy film further containing the N atoms or O atoms. Hence it is possible to perform selective etching or simultaneous etching without causing damage on the oxide (or nitride) semiconductor film in the lower layer as in the second preferred embodiment, so as to process the film in a favorable pattern shape, and it is also possible to solve the problem of deterioration in ohmic contact characteristics of the typical Cu film due to its contact with the oxide semiconductor film 2, so as to make favorable the contact characteristics with the oxide semiconductor film 2 (or nitride semiconductor film) in the lower layer and with the transparent conductive film (pixel electrode 9, source terminal pad 33) including the IZO film in the upper layer, and the like.

Further, it is possible to set the concentration of ammonium persulfate in the ammonium persulfate solution not only to 0.3 wt % but also to the range of not lower than 0.02 wt % and not higher than 10 wt % with a solution temperature being from 10° C. to 50° C., for example. When the concentration of the ammonium persulfate solution is lower than 0.02 wt %, an etching rate of the Cu alloy film significantly decreases, to make etching difficult to perform. On the other hand, when the ammonium persulfate concentration is higher than 10 wt %, a side etching amount (regressed amount from the end of the resist pattern to the end of the Cu alloy film pattern) may become larger, to cause deterioration in pattern processing accuracy in plane patterning.

Further, although the examples were described in the first and second preferred embodiments where the oxide semiconductor film (IGZO) including indium oxide, gallium oxide or zinc oxide is applied as the semiconductor film 2 constituting the TFT, the material is not limited thereto.

Basically, when the semiconductor film is a semiconductor film having translucency with respect to back light and has small light absorption, that is, a semiconductor film influenced in a small degree by the photo carrier, even in the case of directly forming the semiconductor film on the transparent glass substrate as in the present structure, it is possible to obtain the effect of being influenced in a small degree by deterioration in TFT characteristics due to a light leak current at the time of irradiation with back light from the substrate surface. For this reason, it is possible to apply a semiconductor which, for example, includes a nitride semiconductor mainly containing a group 13 element, or a mixture of these oxide and nitride.

Herein, examples of the nitride semiconductor include one mainly containing a binary nitride such as Al—N, Ga—N or In—N and a mixture thereof, and examples of the oxide semiconductor include one mainly containing a ternary oxide such as In—Ga—O or Al—In—O and a mixture thereof.

It is to be noted that in the case of using the nitride semiconductor as the semiconductor film 2, resistance to an acidic medical solution improves as compared with the case of using the oxide semiconductor such as the IGZO system, and hence a mixed acidic aqueous solution is used which is, for example, mainly containing oxalic acid, phosphoric acid as a stronger acid than oxalic acid, and the like. Since this mixed acidic aqueous solution can etch the Al alloy film and the Cu alloy film, it is possible to simultaneously etch the first conductive film 15 and the semiconductor film 14.

This is applicable to the semiconductor film so long it is an oxide or nitride semiconductor film containing at least either N atoms or O atoms, and even in the case of using these, it is possible to obtain a similar effect to the first and second preferred embodiments. Further, it is possible to obtain a high-performance TFT by use of the non-Si semiconductor film 2.

It should be noted that in the present specification, the main component is defined as one having the largest composition ratio among two or more kinds of components constituting a substance.

OTHER MODIFIED EXAMPLES

The examples have been described in the first and second preferred embodiments described above where the gate electrode 7, the gate line 71, the pixel electrode 9, the auxiliary capacitance connecting line 12 and the source terminal pad 33 are formed using the transparent conductive film including IZO as the second conductive film. However, as shown in FIGS. 23 and 24, the gate electrode 7 and the gate line 71 may be formed of two or more laminated films of the transparent conductive film and the metal film.

Figure 23:
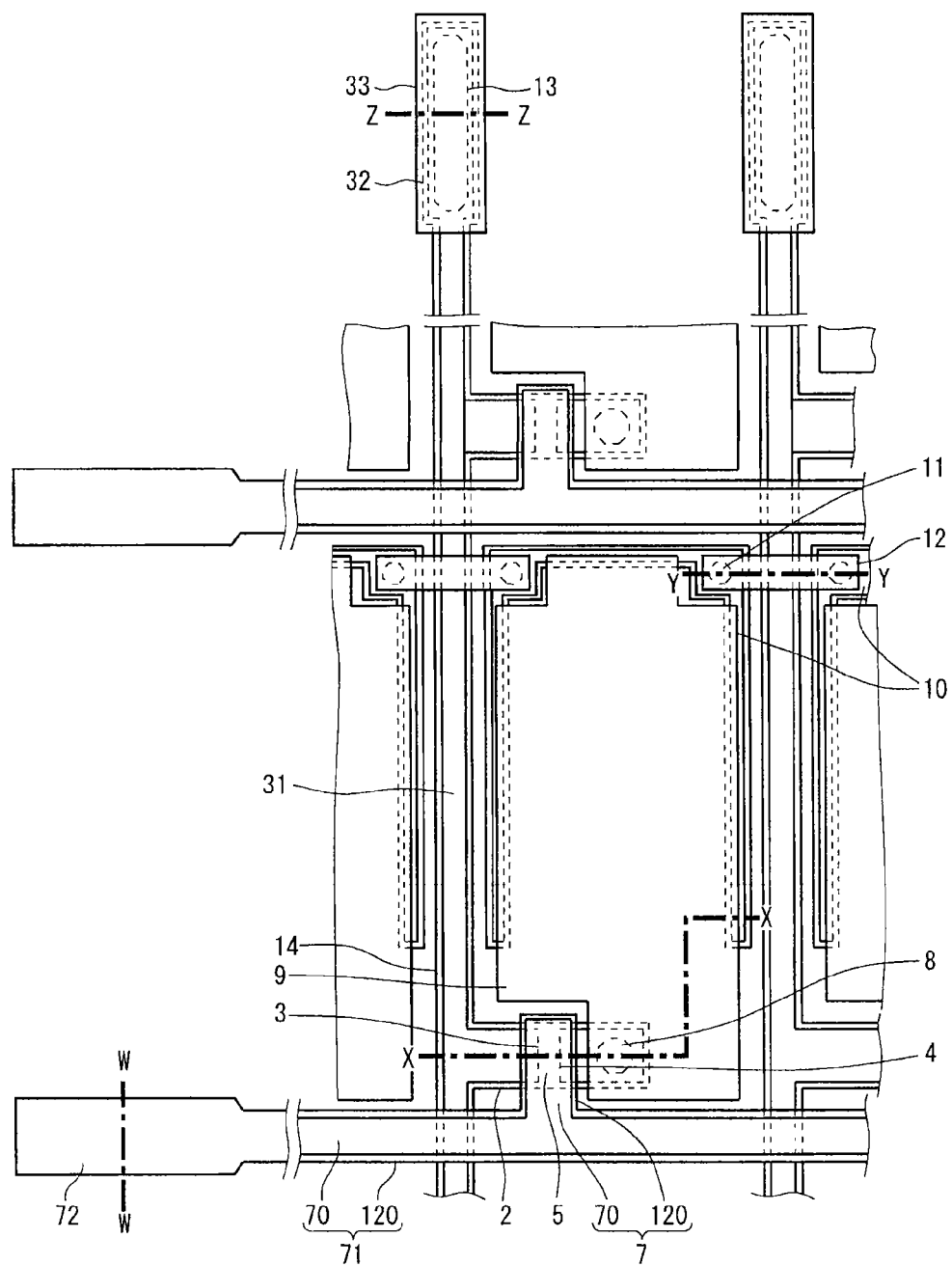
FIG. 23 is a plan view describing a configuration of a modified example of the thin film transistors in the first and second preferred embodiments according to the present invention.
Figure 24:
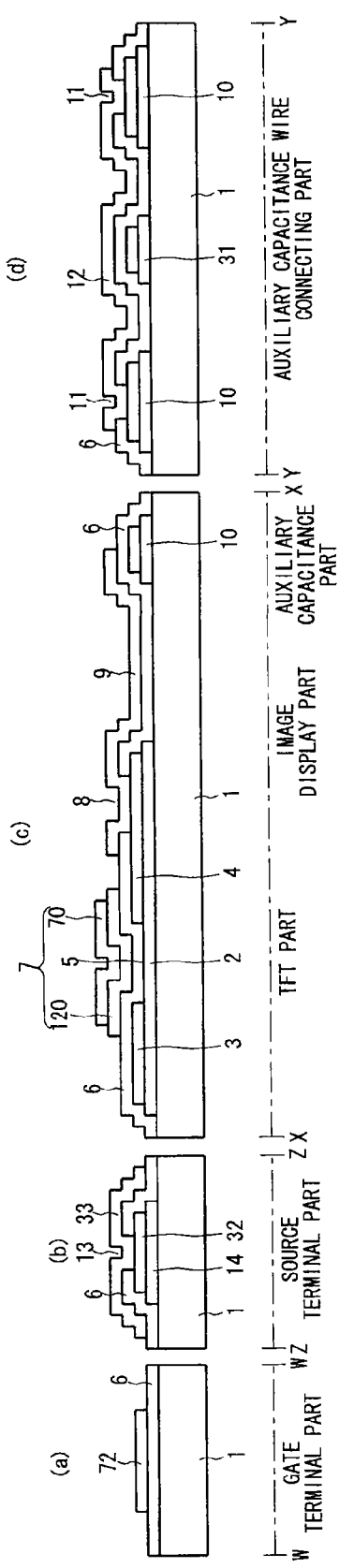
FIG. 24 is a sectional view describing the configuration of the modified example of the thin film transistors in the first and second preferred embodiments according to the present invention.

That is, as shown in FIG. 23 and the (c) part in FIG. 24, the gate electrode 7 and the gate line 71 may be configured of the metal film 70 laminated on the transparent conductive film 120. It is thereby possible to reduce an electric resistance value of the gate line 71, so as to deal with upsizing of the display.

Figure 25:
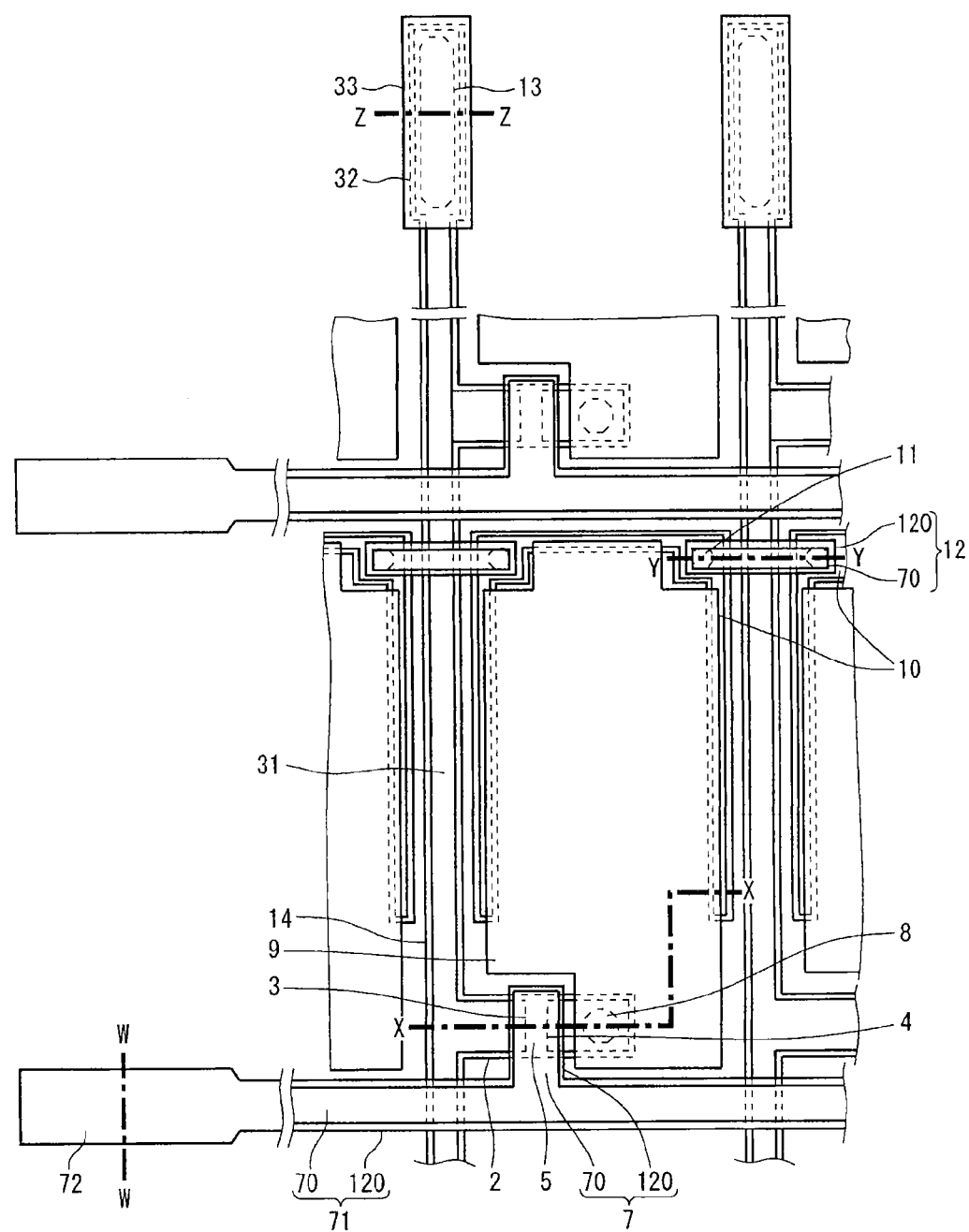
FIG. 25 is a plan view describing a configuration of a modified example of the thin film transistors in the first and second preferred embodiments according to the present invention.
Figure 26:
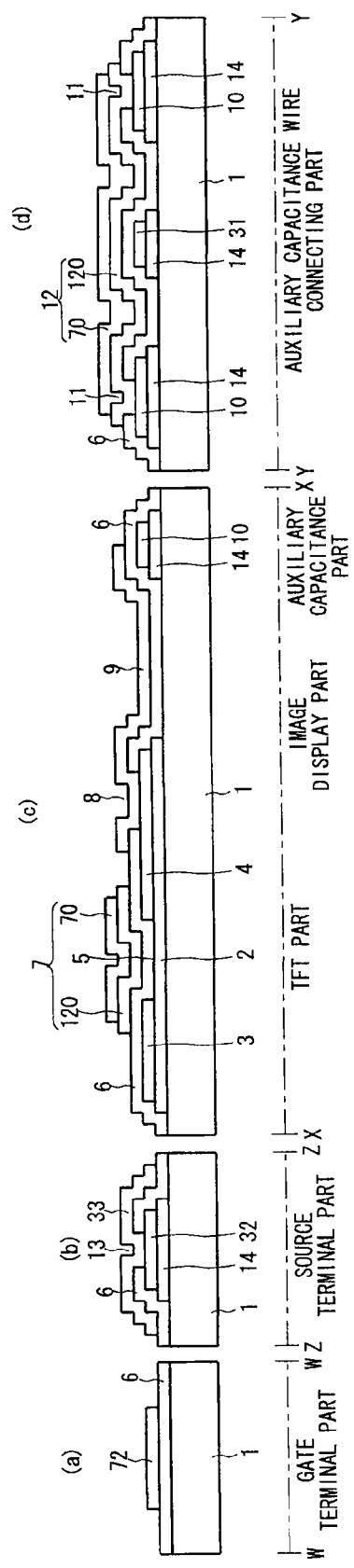
FIG. 26 is a sectional view describing the configuration of the modified example of the thin film transistors in the first and second preferred embodiments according to the present invention.

Further, for example as shown in FIGS. 25 and 26, the auxiliary capacitance electrode connecting line 12 may also be formed of two or more laminated films of the transparent conductive film and the metal film.

That is, as shown in FIG. 25 and the (d) part in FIG. 26, the auxiliary capacitance electrode connecting line 12 may be configured of the metal film 70 laminated on the transparent conductive film 120. It is thereby possible to reduce an electric resistance value of the auxiliary capacitance line 12, so as to deal with upsizing of the display.

Such a configuration can be obtained, for example, as the second conductive film by implementing the two-layered film patterning steps similar to the steps described using FIGS. 6 to 11 in the first preferred embodiment or the steps described using FIGS. 16 to 22 in the second preferred embodiment after the transparent film and the metal film have been formed in this order.

More specifically, a photoresist pattern having a partially different film thickness, such as the resist pattern 16 described in FIG. 8 or 18 by the third photolithography step. This photoresist pattern is formed such that the portions corresponding to portions above the gate electrode 7 and the gate line 71 are larger than the other portion, and by using this pattern, the metal film 70 is made to remain on the gate electrode 7 and the gate line 71, and the metal film 70 in the other portion is removed.

That is, as described using FIGS. 10 and 21, resist ashing is performed on the photoresist pattern with a small thickness in the portion other than the portions above the gate electrode 7 and the gate line 71, by means of oxygen gas plasma. By this resist ashing, only the photoresist with a smaller thickness is removed, and the photoresist is made to remain in the other portion with a larger thickness. This leads to removal of the photoresist pattern in the portion other than the portions above the gate electrode 7 and the gate line 71. By etching the metal film 70 with this mask used as the etching mask, the metal film 70 can be made to remain only in the portions above the gate electrode 7 and the gate line 71.

As shown in FIGS. 25 and 26, using this method, the auxiliary capacitance electrode connecting line 12 can also be formed of two or more laminated films of the transparent conductive film and the metal film.

Further, in the first and second preferred embodiments, there has been described the effect of using the non-Si semiconductor film such as the semiconductor including the oxide semiconductor film 14, the nitride semiconductor or a mixture of these oxide and nitride as the semiconductor film 2 for constituting the TFT. However, when the semiconductor film 2 is a semiconductor film influenced in a small degree by a light leakage due to the photo carrier, similarly to the first and second preferred embodiments, the increase in manufacturing process is not incurred by formation of the light shield film between the foundation substrate and the semiconductor film 2, thereby allowing realization of the liquid crystal display having high display quality and no display inconsistencies.

Hence, even Si as a widely used semiconductor material, more specifically, amorphous silicon or crystalline silicon, can be used as the semiconductor film 2 by adjustment to reduce the influence of light leakage by appropriately decreasing the film thickness.

In this case, there slightly occur deterioration in ON characteristics of the TFT and deterioration in contrast ratio accompanied thereby due to the decrease in film thickness of the semiconductor film 2 and the use of Si having inferior mobility as compared with the oxide semiconductor film for the semiconductor film 2. However, the effects other than the above can be obtained which are similar to those in the first and second preferred embodiments.

It is to be noted that the present invention is not restricted to the above embodiments, but can be modified as appropriate in the range not deviating from the gist thereof.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor substrate with a plurality of pixels arrayed in matrix shape, each of said pixels comprising:
    a thin film transistor including:
        a semiconductor film disposed in a plurality of portions on a substrate,
        a source electrode and a drain electrode which are disposed, on said semiconductor film of a first part on said substrate, in contact with the semiconductor film while being spaced from each other, and including a first conductive film,
        a gate insulating film which includes an insulating film and coats said semiconductor film, said source electrode and said drain electrode, and
        a gate electrode which is disposed across said source electrode and said drain electrode via said gate insulating film and including a second conductive film;
    an auxiliary capacitance electrode which is disposed on said semiconductor film of a second part on said substrate while in contact with said semiconductor film, and including said first conductive film;
    a source line which has said semiconductor film in a lower layer thereof, extends from said source electrode, and includes said first conductive film;
    a gate line which extends from said gate electrode and includes said second conductive film;
    a pixel electrode which is electrically connected to said drain electrode, and including said second conductive film; and
    an auxiliary capacitance electrode connecting line which is electrically connected to said auxiliary capacitance electrode, electrically connects said auxiliary capacitance electrode of one pixel to said auxiliary capacitance electrode of each adjacent pixel, and includes said second conductive film,
    wherein
    said auxiliary capacitance electrode and said source line are coated by said insulating film, and
    said gate line, said pixel electrode and said auxiliary capacitance electrode connecting line are disposed on said insulating film.

2. The thin film transistor substrate according to claim 1, wherein
    said source line extends in a first direction on said substrate in a plan view,
    said gate line extends in a second direction orthogonal to said first direction, and
    auxiliary capacitance electrodes in adjacent pixels are electrically serially connected in said second direction in said plan view by said auxiliary capacitance electrode connecting line.

3. The thin film transistor substrate according to claim 1, wherein
    said second conductive film includes a transparent conductive film, and
    said gate line further includes a conductive film disposed on said transparent conductive film.

4. The thin film transistor substrate according to claim 1, wherein said semiconductor film is configured of an oxide semiconductor film including zinc oxide, gallium oxide or indium oxide, or a nitride semiconductor film including a nitride comprising a group 13 element.

5. The thin film transistor substrate according to claim 4, where said nitride semiconductor film comprises at least one nitride selected from the group consisting of Al—N, Ga—N and In—N.

6. The thin film transistor substrate according to claim 4, wherein said first conductive film includes an aluminum alloy film comprising aluminum and at least one element selected from the group consisting of nickel, palladium and platinum.

7. The thin film transistor substrate according to claim 4, wherein said first conductive film includes
    an aluminum film comprising nitrogen or oxygen, or
    an aluminum alloy film comprising nitrogen or oxygen, aluminum, and at least one element selected from the group consisting of nickel, palladium and platinum.

8. The thin film transistor substrate according to claim 4, wherein said first conductive film includes a copper film or a copper alloy film comprising copper and at least one element selected from the group consisting of titanium, vanadium, chromium, manganese, iron and nickel.

9. The thin film transistor substrate according to claim 4, wherein said first conductive film includes
    a copper film comprising nitrogen or oxygen, or
    a copper alloy film comprising nitrogen or oxygen, copper, and at least one element selected from the group consisting of titanium, vanadium, chromium, manganese, iron and nickel.

10. A method of manufacturing the thin film transistor substrate of claim 1, the method comprising:
    (a) forming said semiconductor film and said first conductive film in this order on a substrate;
    (b) patterning said first conductive film by a first photolithography process, to form said source electrode, said drain electrode, said auxiliary capacitance electrode and said source line, and also patterning said semiconductor film in a lower layer of said source electrode, said drain electrode, said auxiliary capacitance electrode and said source line such that said semiconductor film remains;
    (c) forming said gate insulating film which coats said source electrode and said drain electrode;
    (d) forming, by a second photolithography process, a plurality of first and second contact holes which penetrate said gate insulating film and respectively reach a surface of said drain electrode and a surface of said auxiliary capacitance electrode; and
    (e) forming said second conductive film, patterning said second conductive film by a third photolithography process, and forming said gate electrode, said gate line, said pixel electrode which is electrically connected to said drain electrode via said first contact hole, and said auxiliary capacitance electrode connecting line which is electrically connected to said auxiliary capacitance electrode via said second contact hole,
    wherein said patterning (b) comprises forming a first resist pattern having partially different film thicknesses due to at least two stages of exposure, and
    said first resist pattern is formed such that a thickness of a portion corresponding to a portion above a channel part between said source electrode and said drain electrode is smaller than thicknesses of the other portion.

11. The method according to claim 10, wherein
    said forming (e) comprises:
    laminating a transparent conductive film and a conductive film including a metal in this order to form said second conductive film, and
    forming a second resist pattern having partially different film thicknesses due to at least two stages of exposure by said third photolithography process, and
    said second resist pattern is formed such that a portion corresponding to portions above said gate electrode and said gate line has a larger thickness than the other portion, to make said conductive film remain on said gate electrode and said gate line.

12. The manufacturing method according to claim 10, wherein:
   in said forming (a), said semiconductor film comprises an oxide semiconductor film including zinc oxide, gallium oxide or indium oxide, or a nitride semiconductor film comprising a nitride comprising a group 13 element, and
   said first conductive film comprises an aluminum alloy film comprising aluminum and at least one element selected from the group consisting of nickel, palladium and platinum, and
   said of patterning (b) comprises:
   (b1) sequentially removing said first conductive film and said semiconductor film with said first resist pattern used as an etching mask,
   (b2) thinning said first resist pattern, to form a thinned resist pattern with the portion corresponding to the portion above said channel part removed, and
   (b3) removing said first conductive film on said channel part of said semiconductor film, with said thinned resist pattern as an etching mask, to form said source electrode and said drain electrode which are spaced from each other.

13. The method according to claim 12, wherein (b1) includes etching said first conductive film with an organic alkaline solution comprising tetramethylammonium hydroxide (TMAH).

14. The method according to claim 10, wherein in said forming (a), said semiconductor film comprises an oxide semiconductor film including zinc oxide, gallium oxide or indium oxide, or a nitride semiconductor film comprising a nitride comprising a group 13 element, and
   said first conductive film comprises a copper film or a copper alloy film comprising copper and at least one element selected from the group consisting of titanium, vanadium, chromium, manganese, iron and nickel, and
   said patterning (b) comprises:
   (b1) sequentially removing said first conductive film and said semiconductor film with said first resist pattern used as an etching mask,
   (b2) thinning said first resist pattern, to form a thinned resist pattern with the portion corresponding to the portion above said channel part removed, and
   (b3) removing said first conductive film on said channel part of said semiconductor film, with said thinned resist pattern as an etching mask, to form said source electrode and said drain electrode which are spaced from each other.

15. The method according to claim 14, wherein (b1) includes etching said first conductive film with a solution comprising ammonium persulfate.

* * * * *